United States Patent
Chin et al.

(10) Patent No.: US 9,337,421 B2
(45) Date of Patent: May 10, 2016

(54) MULTI-LAYERED PHASE-CHANGE MEMORY DEVICE

(71) Applicant: FENG CHIA UNIVERSITY, Taichung (TW)

(72) Inventors: Tsung-Shune Chin, Hsinchu County (TW); Chih-Chung Chang, Nantou County (TW); Yung-Ching Chu, Hsinchu County (TW)

(73) Assignee: FENG CHIA UNIVERSITY, Taichung (TW)

( * ) Notice: Subject to any disclaimer, the term of this patent is extended or adjusted under 35 U.S.C. 154(b) by 56 days.

(21) Appl. No.: 13/874,411

(22) Filed: Apr. 30, 2013

(65) Prior Publication Data

US 2013/0292631 A1 Nov. 7, 2013

(30) Foreign Application Priority Data

May 7, 2012 (TW) .............................. 101116245 A

(51) Int. Cl.
 *H01L 45/00* (2006.01)
(52) U.S. Cl.
 CPC ............ *H01L 45/1253* (2013.01); *H01L 45/06* (2013.01); *H01L 45/1226* (2013.01); *H01L 45/1233* (2013.01); *H01L 45/148* (2013.01); *H01L 45/1616* (2013.01)
(58) Field of Classification Search
 CPC ........... G11C 11/5678; G11C 13/0069; G11C 13/0004; H01L 45/06; H01L 45/148; H01L 45/1641
 USPC .................................. 257/2, 3, 4, 5; 365/148
 See application file for complete search history.

(56) References Cited

U.S. PATENT DOCUMENTS

| | | | |
|---|---|---|---|
| 5,837,564 A * | 11/1998 | Sandhu et al. | 438/95 |
| 7,807,989 B2 | 10/2010 | Lee et al. | |
| 2004/0178404 A1* | 9/2004 | Ovshinsky | 257/4 |
| 2005/0029502 A1* | 2/2005 | Hudgens | 257/4 |
| 2006/0046509 A1* | 3/2006 | Gwan-Hyeob | 438/758 |
| 2007/0187801 A1* | 8/2007 | Asao et al. | 257/613 |
| 2008/0017842 A1* | 1/2008 | Happ et al. | 257/4 |
| 2008/0094885 A1* | 4/2008 | Ho et al. | 365/163 |
| 2009/0045385 A1* | 2/2009 | Happ et al. | 257/2 |

(Continued)

FOREIGN PATENT DOCUMENTS

TW 201138172 A1 11/2011

OTHER PUBLICATIONS

Chen "Role of Nitrogen in the Crystallization of Silicon Nitride-Doped Chalcogenide Glasses" J. Am. Ceram. Soc., 82 [10] 2934-36 (1999).*

(Continued)

*Primary Examiner* — Ermias Woldegeorgis
*Assistant Examiner* — John Bodnar
(74) *Attorney, Agent, or Firm* — Cheng-Ju Chiang

(57) ABSTRACT

The present invention relates to a phase-change memory device structure and the materials used. The structure comprises a substrate, a single or multiple sandwich-memory-unit (s), a first electrode, and a second electrode. The sandwich-memory-unit contains an upper barrier layer, a lower barrier layer, and a memory layer therebetween. The thickness of the memory-layer is less than 30 nm. The present invention provides a phase-change memory device with a high Tc and a low volume changing rate during phase-change.

18 Claims, 11 Drawing Sheets

(56) References Cited

U.S. PATENT DOCUMENTS

| | | | |
|---|---|---|---|
| 2009/0194758 A1* | 8/2009 | Chen | 257/4 |
| 2009/0212274 A1 | 8/2009 | Breitwisch et al. | |
| 2009/0283738 A1* | 11/2009 | Lee et al. | 257/4 |
| 2010/0046285 A1* | 2/2010 | Lung | 365/163 |
| 2012/0187360 A1* | 7/2012 | Eungyoon | 257/2 |
| 2013/0228739 A1* | 9/2013 | Sasago et al. | 257/4 |

OTHER PUBLICATIONS

G. Chen, J. Cheng, and W. Chen, "Effects of Si3N4 on Chemical Durability of Chalcogenide Glasses," J. Non-Cryst. Solids, 220 [2-3] 249-53 (1997).*

Ting Zhang, Zhitang Song, Feng Wang, Bo Liu, Songlin Feng and Bomy Chen; "Advantages of SiSb Phase-Change Material and Its Applications in Phase-Change Memory"; Applied Physics Letters; 2007; pp. 222102-1 to 222102-3; vol. No. 91, Issue No. 222012; American Institute of Physics.

Tae Jin Park, Dae Hyun Kim, Sung Jin Park, Se Young Choi, Sung Min Yoon, Kyu Jeong Choi, Nam Yeal Lee and Byoung Gon Yu; "Phase Transition Characteristics and Nonvolatile Memory Device Performance of ZnxSb100-x Alloys"; Japanese Journal of Applied Physics; 2007; pp. L543-L545; vol. No. 46, Issue No. 23; The Japan Society of Applied Physics.

Feng Rao, Zhitang Song, Kun Ren, Xuelai Li, Liangcai Wu Wei Xi and Bo Liu; "Sn12Sb88 Material Phase Change Memory"; Applied Physics Letters; 2009; pp. 032105-1 to 032105-3; vol. No. 95, Issue No. 032105; American Institute of Physics.

Chih-Chung Chang, Po-Chin Chang, Kin Fu Kao, Tri-Rung Yew, Ming Jinn Tsai and Tsung-Shune Chin; "C-Sb Materials as Candidate for Phase-Change Memory"; IEEE Transactions on Magnetics; Mar. 2001; pp. 645 to 648; vol. No. 47, Issue No. 3; IEEE.

L. S. Palatnik and V. M. Kosevich; "Investigation of Diffusion and Diffusionless Transformations in Amorphous Films of Antimony"; Technical Physics; Apr. 9, 1958; pp. 818 to 821.

Hisashi Horikoshi and Noriko Tamura; "Internal Stress and Electrical Resistivity of Evaporated Antimony Films"; Japanese Journal of Applied Physics; Jun. 1963; pp. 328 to 336; vol. No. 2, Issue No. 6.

A. Kinbara, M. Ohmura and A. Kikuchi; "Crystallization of Amorphous Antimony Films"; Thin Solid Films; 1976; pp. 37-40; vol. No. 34; Elsevier Sequoia S.A., Lausanne; Switzerland.

Mituru Hashimoto; "Growth and Crystallization of Sb-Bi Films Deposited in a Vacuum of 10-5 Pa"; Thin Solid Films; 1985; pp. 171-180; vol. No. 130; Elsevier Sequoia; Netherlands.

* cited by examiner

MULTI-LAYERED PHASE-CHANGE MEMORY DEVICE

BACKGROUND OF THE INVENTION

1. Field of the Invention

The present invention is related to a memory device, more particularly to structures and materials of a non-volatile phase-change memory device.

2. Description of Prior Art

Along with technology advancement, demands for a high quality non-volatile memory have been asked for. Except for high reliability, fast operation speed, high cyclability and large storage capacity become basic requirements. Accordingly, various types of non-volatile memories (NVM) for the next generation are emerging. These include but not limited to Magnetoresistive Random Access Memory (MRAM), Oxide-based Resistive Random Access Memory (RRAM), Ferroelectric Random Access Memory (FRAM), and Phase-Change Memory (PCM). Among them PCM utilizes a material whose phases can be changed rapidly and reversibly between an amorphous phase and a counterpart crystalline phase. Moreover, high electrical resistance of the amorphous phase and low electrical resistance of the crystalline phase provide high well-defined states, which can be made into two-bit non-volatile storage to multi-bits non-volatile storage.

Comparing to other technologies of the emerging non-volatile memories, operating speed, scalability, device reliability, process compliance, and manufacturing cost of the PCM make it with better competitiveness. Accordingly the Phase-Change Memory (PCM) is suitable for applications of high-density stand-alone or embedded memory. Since PCM has the capability of operation at 0.1~20 ns, it is also potential to replace embedded Dynamic Random Access Memory (DRAM). If so, the high-speed and large capacity PCM is promising as the candidate of universal memory to replace DRAM and FLASH RAM as a whole. Especially, when the feature size is below 32 nanometers (nm) and critical dimension (CD) of a memory device is getting smaller, programming current needed by the PCM cells is also reduced. This is of great advantage for technical development of the Phase-Change Memory.

Conventional materials of the phase-change memory are chalcogenides especially that based on the ternary alloy system: germanium-antimony-tellurium (Ge—Sb—Te) has been the most widely studied. Within the ternary system, $Ge_2Sb_2Te_5$ (GST) possesses an excellent material characteristic, which makes it widely applicable to phase-change compact discs and solid-state memory devices. Phase change between the amorphous and the crystalline phases of $Ge_2Sb_2Te_5$ is very rapid. The resistance difference between the amorphous phase and the crystalline phase reaches five to six orders of magnitude. Crystallization temperature of the amorphous phase is about 160 to 180° C. and melting point is about 635° C.

However, $Ge_2Sb_2Te_5$ (GST) still has drawbacks to be improved. The not high enough crystallization-temperature results in less thermal stability and the temperature for 10-year data retention ($T_{10y}$), being between 86° C. to 93° C., is less than a minimum requirement 100° C. Moreover, melting temperature of GST is rather high making the reset process more energy consuming. Besides, Te in the composition of GST is highly volatile to contaminate semiconductor process-equipment. Te-fume is toxic when exposing to the environment. Te is also very diffusive inside the device to deteriorate electrodes after prolonged operation of the device. This will give rise to a deviation of the original GST stoichiometry and the formation of holes to further decline the reliability and cyclability. Furthermore, a big volume change up to 9.5% occurs when phase changes between amorphous and crystalline phases of $Ge_2Sb_2Te_5$. After long-term cyclability, the integrity of the film is damaged causing the film broken or even congealed into an island structure and even delamination. This further adds into the reliability issues. The biggest problem of all, from the mass-production point of view, $Ge_2Sb_2Te_5$ and its modifications being multi-component are very difficult in precise and reproducible control of composition in manufacturing multi-millions devices a time on a large area base such as on 12-inch wafer.

Many companies and institutes are trying to improve the $Ge_2Sb_2Te_5$ based memory devices. The improvement has been done by adding a fourth and even a fifth element, for instance, nitrogen (N), oxygen (O), silicon (Si), or an extra compound, for instance, silicon dioxide ($SiO_2$). However, adding extra elements or compounds makes the composition even more complicated to worsen process control of device composition.

A binary alloy system excluding Te as a new material of the Phase-Change Memory has been proposed. Antimony (Sb) based binary alloy systems have been extensively explored due to their growth-dominate crystallization mechanism of amorphous phase. For instance the Si—Sb alloy appeared in Applied Physics Letters, Vol. 91, 222102, 2007, authored by T. Zhang, Z. Song, F. Wang, B. Liu, and S. Feng; and the Zn—Sb alloy, appeared in Japanese Journal of Applied Physics, Vol. 46, pp. L543-L545, 2007, authored by T. J. Park, D. H. Kim, S. J. Park, S. Y. Choi, S. M. Yoon, K. J. Choi, N. Y. Lee, and B. G. Yu; the Sn—Sb alloy, appeared in Applied Physics Letters, Vol. 95, 032105, 2009, authored by F. Rao, Z. Song, K. Ren, X. Li, L. Wu, W. Xi, and B. Liu; and the C—Sb alloy, appeared in IEEE Transactions on Magnetics, Vol. 47, pp. 645-647, 2011, authored by C. C. Chang, P. C. Chang, K. F. Kao, T. R. Yew, M. J. Tsai, and T. S. Chin. However, the aforementioned binary alloys cannot escape from a phase separation problem which means two crystal phases occurred in the amorphous phase during crystallization. This is a great challenge for the reliability of the memory devices. On the other hand, single element as the material of the Phase-Change Memory (PCM) can be an optimal choice. The patent application No. Tw 201138172 filed by the current inventors is one of breakthrough achievements of this technology.

Scientists have been studying whether single Antimony (Sb) element or single Bi (Bi) element can be the material of the Phase-Change Memory (PCM). Nevertheless, in the mid-20th century scientists discovered that as-prepared single element Antimony (Sb) film crystallizes spontaneously at room temperature unless the thickness is under a critical value. The value of critical thickness varies among reports due to the variation in each case the evaporation rate, substrate material, vacuum degree, or deposition method. In 1958, Palatnik and Kosevich discovered the critical Sb-film thickness of 15 to 25 nm on metallic or glass substrates, which appeared in Soviet Physics Doklady, Vol. 3, p. 818. In 1963, H. Horikoshi and N. Tamura discovered that when the evaporation rate is 35 nm/min the critical thickness of the Sb film deposited on a glass substrate is 50 nm, published in Japanese Journal of Applied Physics, Vol. 2, pp. 328-336. In 1976, A. Kinbara, M. Ohmura, and A. Kikuchi found the critical Sb-film thickness of 12.8 nm published in Thin Solid Films, Vol. 34, pp. 37-40. They also discovered that the crystallization temperature is greatly raised when the thickness of the film decreases from 100 nm to 10 nm; moreover, an equation was derived for the relationship between the crystallization temperature (Tc, in unit of Kelvin) and the thickness (d, in nm) That is $Tc=T_0+C/d$ wherein $T_0$ and C are constants representing 250 K and 1 nm, respectively. In 1985, M. Hashimoto discovered that the thickness of a vacuum-deposited Sb film on a colloidion film is 11 to 16 nm; the critical thickness of a Bi film is 8 to 9 nm, published in Thin Solid Films, Vol. 130, pp. 171-180. However, above derived crystallization temperature of the amorphous films is just above room temperature, which is unable to be implemented to phase-change applications.

Scientists continuously researched into solving the problem of low crystallization temperature. The U.S. Pat. No. 7,807,989 B2 disclosed that under the critical thickness, the crystallization temperature of the Sb film doped with large amount of Oxygen and Nitrogen (about 30 atom percent, at %) is significantly raised. The cyclability of a device made thereof can reach dozens of times. The U.S. application Pub. No. 2009/0212274 disclosed a phase-change memory (PCM) made of pure Sb film whose thickness is controlled to be below 5 nm, the crystallization temperature can be raised, very much similar to the earlier study of Kinbara et. al., in 1976. Although the thickness is thinner in U.S. application Pub. No. 2009/0212274, the relation between crystallization temperature (Tc) and thickness holds as $Tc=T_0+C/d$, with $T_0$ and C representing 345 K and 250 nm, respectively. Moreover, in the US 2009/0212274, when the thickness of the Sb film is 5 nm, the Tc is only 30° C. (303 K). When the thickness is 4 nm, the Tc is 140° C. (413 K). Two issues soon arise. Tc of 4 nm pure Sb film is 20~30° C. lower than that of GST hence is difficult in applying to the Phase-Change Memory (PCM) devices. Although Tc of 2 nm or 1.5 nm Sb-film is 210 and 240° C., respectively, being high enough for true application, the second issue soon arises. The sharp variation in Tc versus a subtle change in film thickness (such as 0.5 nm) brings about a difficulty in operation control of the memory device. And the process control to ensure a tolerance within, say 0.1 nm, is extremely difficult in particular the case of large area processing, 12 inch wafer for instance. It is hence a big challenge to keep the Sb film not too thin, for instance, at 5 nm or thicker, meanwhile, maintaining the Tc much higher than that of $Ge_2Sb_2Te_5$ (160 to 180° C.).

The present invention aims to solve the following main technical problems of the existing PCM.

The conventional material of the PCM can be a ternary alloy or multi-component alloy systems, it is not easy to control stoichiometry of the alloy film in nano-sized scale on a large area based manufacturing. And the thin single element film has a Tc too sensitive to a subtle variation in thickness below 4 nm. The present invention aimed to tackle both issues altogether.

The conventional GST material has a huge volume change of nearly 10% during phase change which results in delamination after repeatedly write/erase cycles. The present invention proposes a solution to the volume change issue by a suitable design of phase-change material and by additives to control the volume change to be less than 3%.

The conventional GST material of PCM encounters a substantial resistance drifting issue in the reset state. This gives rise to the reliability problem in multi-level memory. The present invention discloses preferable embodiments to show how to solve it.

SUMMARY OF THE INVENTION

It can be learnt from prior arts that new materials of Phase-Change Memory (PCM) is not usable as its crystallization temperature is rather low benchmarking to that of GST (160~180° C.). If thickness of the film in PCM is too thin, such as in the case of 2 nm or 1.5 nm, reliability of the PCM is challenged due to difficulty in process control of homogeneity within 0.1 nm thickness in large area. Accordingly, the present invention proposes a way that a film made of pure Antimony (Sb) or Bismuth (Bi) is sandwiched between an upper and a lower barrier layers forming a single sandwich-memory-unit to solve the above problems. The crystallization temperature of the Sb film in a sandwich-memory-unit can be raised obviously due to both the sandwiching and the thickness effect. This means that Tc of the Sb (or Bi) film inside can be adjusted by barrier materials used for the sandwiching. On the other hand Tc of thinner Sb (or Bi) film inside the sandwich-memory-unit is also higher.

More than one sandwich-memory-unit with different Tc can be stacked together in parallel or in series for the purpose of multi-bit per cell memory.

In the present invention an extra element is allowed to dope into the Sb (or Bi) film inside a sandwich-memory-unit at an extent lower than the solid solubility in the Sb (or Bi) film. Thus the doped Sb (or Bi) film keeps at single Sb (or Bi) phase status. The performance of the sandwich-memory-unit with doped single element Sb (or Bi) inside can be so adjusted by such a doping while retaining the merit of single element.

Moreover, an inert compound (which is not reacting with Sb or Bi and stable to a high temperature at least 1000° C.) with high electrical resistivity is allowed to add into the Sb (or Bi) film inside the sandwich-memory-unit for the sake of reducing volume ratio of Sb (or Bi). This is for the sake to lowering volume change accompanying with phase change. The film inside the sandwich-memory-unit is thus called a particulate film. Following is a thorough disclosure of the present invention.

First of all, it shall be noted that the first or second component (such as the layers or thin films) inside the structural unit is arbitrarily named for the sake of clarity. It is to differentiate the component at different positions and not in a specific order or using different materials unless so described.

A thin film is usually recognized by materials scientists as the films with thickness below 1 micrometer (μm). In practice thin films of industrial importance is usually between 500 nanometers (nm) and 100 nm. As long as the thickness of films is 50 nm and thinner, the films belong to very thin to thin films. This however is rather arbitrary without absolute definition of thickness range of thin films. In the present invention, the thin film indicates film thickness being below 30 nm which equals 300 Angstrom (Å). A Sb (or Bi) film of 30 nm roughly equals to the close packing of 115 layers of Sb atoms whose diameter being 3.04 Å, or 106 layers of Bi atoms whose diameter being 3.26 Å. As the thickness of Sb film is 15 nm we are talking about a close-stack of 57 atomic layers. For a Sb (or Bi) film of 5 nm we deal with 19 Sb (or 18 Bi) atomic layers tightly packed together. In the present invention, the thinnest thin film depicted is 2 nm which equals to, in close packing of only 8 Sb (or 7 Bi) atomic layers. A film of such thickness, 2 nm, can hardly keep as continuous film status and will gradually coagulate into island structure upon heating unless measures are taken. Accordingly, the present invention further discloses that the thin Sb (or Bi) film for PCM application should be at least 5 nm and better 10 nm and thicker.

The present invention discloses a multi-layered phase-change memory device comprises: a substrate, one single or multiple sandwich-memory-unit(s) which is/are disposed on the substrate, a first electrode-assembly-layer, a second electrode-assembly-layer, and a dielectric layer. A single sandwich-memory-unit comprises a memory-layer which is sandwiched between two protective barrier-layers. The multiple sandwiched-memory-units are composed more than two sandwich-memory-units disposing in series or in parallel. The first electrode-assembly-layer being next to and electrically connected to the single or multiple sandwich-memory-unit(s) comprises a first electrode and a first electrical conductive barrier layer. The first electrode is next to and electrically connected to the first electrical conductive barrier layer. The second electrode-assembly-layer being next to and electrically connected to the single or multiple sandwich-memory-unit(s) comprises a second electrode and a second electrical conductive barrier layer. The second electrode is next to and electrically connected to the second electrical conductive barrier layer. The dielectric layer is disposed on the substrate.

The thickness of the memory-layer ranges from 2 nm to 30 nm, and better 5 nm to 20 nm. The 2 nm memory-layer in the present invention preserves as continuous film due to the sandwiching effect. When there are multiple sandwich-memory-units, the thickness of each memory-layer in the multiple sandwich-memory-units can be different. Material of the memory-layer in the multiple sandwich-memory-units can also be different. Therefore, it facilitates a circuit-designer much freedom of choices for optimal device performance, such as the control of levels in multi-level memory.

This invention discloses that by the structure of sandwich-memory-unit, the crystallization temperature (Tc) is not lower than 100° C. as the thickness of the memory-layer inside is 15 nm. And Tc is raised no less than 50° C. to at least 150° C. as the thickness is reduced from 15 nm to 5 nm. Moreover, the volume change is not larger than 3%, typically smaller than 2%, during each set-reset phase change.

The material of the memory-layer in the sandwich-memory-unit is selected from single elements in various degrees of purity. It includes one from the combination of undoped Antimony (Sb) element, doped single Sb-phase solid solution, undoped Bi (Bi) element, and doped single Bi-phase solid solution. The doped single Sb-phase solid solution is attained by doping pure Sb with another element or elements within the limit of solid solubility. The doping concentration can be up to 18 atom percent (at %). The doping element(s) can be chosen from, but not limited to, carbon, nitrogen, oxygen, boron, aluminum, gallium, bismuth, tellurium, silicon, germanium, or the combination thereof. The doped single Bi-phase solid solution is attained by doping pure Bi element with another element or elements within the limit of the solid solubility. The doping concentration can be up to 18 atom percent (at %). The element(s) can be chosen from gallium, antimony, silicon, germanium, carbon, nitrogen, oxygen, boron, aluminum, bismuth, tellurium, or the combination thereof. The described elements or the doping concentration will be illustrated in various embodiments. Other doping elements without departing from the spirit and the scope of the present invention are intended to include within the appended claims.

The memory-layer inside the sandwich-memory-unit can be a granular thin film. Such a granular film is comprising of the undoped Sb-film or undoped Bi-film as the functional memory-layer in which inert and high resistivity nanoparticles are homogeneously dispersed. The inert nanoparticles serve to reduce volume change in phase change as well as to raise electrical resistivity of the granular film. They are not designed to increase crystallization temperature of the memory film. Size of the inert nanoparticles is limited to be less than the thickness of the granular thin film. The content of the inert nanoparticles is 3 to 50 mole percent (mol %). The inert nanoparticles inside the granular thin film can be chosen from oxides, nitrides, carbides, silicides, borides, or antimonides of silicon, aluminum, hafnium, zirconium, or titanium, or the combination thereof.

The first and the second electrical conductive barrier layers of the sandwich-memory-unit should have an electrical resistivity less than 1000 mΩ-cm at room temperature, more typically between 0.1 mΩ-cm and 500 mΩ-cm. The material of chosen should be a stable solid state up to a temperature at least 1000° C. Moreover, it is not allowed to react physically or chemically with the memory-layer. The material can be chosen from tungsten, molybdenum, ruthenium, tantalum, rhenium, iridium, silicon carbide, molybdenum silicide, lanthanum hexaboride, titanium carbide, tantalum carbide, titanium boride, hafnium antimonide, ruthenium oxide, titanium nitride, tantalum nitride, titanium antimonide, yttrium antimonide, zirconium antimonide, lanthanum-nickel oxide, or the combination thereof.

Material of the first and the second electrodes should possess an electrical resistivity lower than those of the conductive barrier layers. The electrical resistivity is usually less than 50 mΩ-cm at room temperature, and typically between 0.02 and 5 mΩ-cm. They should be a stable solid state at a temperature at least 1200° C. The material can be chosen from ruthenium, tungsten, tantalum, ruthenium oxide, ruthenium dioxide, titanium nitride, or tantalum nitride.

Material of the dielectric layer is chosen from those will not react physically or chemically with the memory-layer at a temperature of 1200° C. It can be chosen from silicon dioxide, silicon nitride, silicon oxynitride, aluminum oxide, aluminum nitride, hafnium oxide, titanium oxide, or magnesium oxide.

The single or multiple sandwich-memory-unit(s) of the multi-layered phase-change memory device can be connected in series. This means that the current provided by the first and the second electrodes flows vertical to the plane of the memory-layer. As shown in FIG. 1(A), the barrier layers of the single or multiple sandwich-memory-unit(s) are electrically conductive and the material of the two conductive barrier layer is the same. At room temperature, an electrical resistivity of the conductive barrier layer is less than 1000 mΩ-cm. The material of the conductive barrier layer can keeps as a stable solid state up to a temperature at least 1000° C. It is not allowed to react physically or chemically with the memory-layer. It can be chosen from tungsten, molybdenum, ruthenium, tantalum, rhenium, iridium, silicon carbide, molybdenum silicide, lanthanum hexaboride, titanium carbide, tantalum carbide, titanium boride, hafnium antimonide, ruthenium oxide, titanium nitride, tantalum nitride, titanium antimonide, yttrium antimonide, zirconium antimonide, or lanthanum-nickel oxide, or the combination thereof.

The single or multiple sandwich-memory-unit(s) of the multi-layered phase-change memory device can also be connected in parallel structure. This means that the current provided by the first and the second electrodes is parallel to the plane of the memory-layer. As shown in FIG. 3, each barrier layer of the single or multiple sandwich-memory-unit(s) is electrically insulating. Material of the insulating barrier layer is not allowed to react physically or chemically with the memory-layers as the temperature is at least 1200° C. The material can be chosen from antimony oxide, zirconium oxide, hafnium oxide, titanium oxide, aluminum nitride, silicon nitride, silicon oxide, silicon oxynitride, aluminum oxide, or magnesium oxide.

The single sandwich-memory-unit as a three-layered structure comprising the memory-layer in between the upper and lower barrier layers can be deposited on the substrate solely, and disposed between the first electrode and the second electrode for implementation. In addition, the multiple sandwichmemory-units are connected in parallel or in series on the substrate and located between the first electrode and the second electrode. This leads to the resultant multiple-layered structure. The barrier layers on top or under the memory-layer are used for the purpose of greatly raising crystallization temperature of the memory-layer and to prevent inter-diffusion between the electrodes and the memory-layers. Such inter-diffusion will lead to a thickness change or even to failure due to possible reactions.

The electrical characteristic of the barrier layers depends on the structure of being connected in series or in parallel. The barrier layer is electrically conducting when electrodes are series-connected with the memory-layer, and are insulating when paralleled-connected. The barrier layer also serves the function of adjusting total electrical resistance of sandwich-memory-unit to meet the requirement of optimal operation.

In the parallel connection, extra side barrier-layers are required to shield the stacked sandwich-memory-units and the side electrodes. The side-barriers should be electrically conductive and in intimate contact with the side electrodes to constitute the "electrode-assembly-layer". The first side-barrier-layer is adjacent to the first electrode, and the second side-barrier-layer to the second electrode. Such a structure design is to avoid the possible failure due to any physical or chemical reactions between the memory-layers and the electrode materials. The memory-layer in parallel stack being in edge contacts with the electrodes is susceptible to failure by an infinitesimal reaction if no barrier layer is used.

The present invention discloses the type of memory-layer which can be either a thin single Sb-phase or single Bi-phase film sandwiched in between the upper and lower barrier layers forming the single sandwich-memory-unit. Several sandwich-memory-units can be connected in series or in parallel to constitute the multi-layered phase-change memory device. Here multiple means at least two sandwich-memory-units are used. The single Sb- or Bi-phase film in the present invention has a thickness under 30 nm. A more preferred thickness ranges from 15 nm to 5 nm and even to 2 nm as the minimal thickness. When the thickness is 5 nm to 2 nm, it is better to adopt Atomic Layer Deposition (ALD) for a better film quality which is not reachable by conventional sputter-deposition.

However, the thickness of the memory-layer is not the main technical characteristics in the present invention. More significant technical characteristics of present invention are summarized as following:

1. The thin single Sb- or Bi-phase film is sandwiched in between an upper and a lower barrier layers forming the single sandwich-memory-unit. Multiple sandwich-memory-units can be connected in series or in parallel to constitute the memory devices.
2. As the thickness of the single Sb- or Bi-phase memory film is reduced from 15 nm to 5 nm its crystallization temperature can be greatly raised due to the sandwiching effect. In addition, the extent of such a raise reaches 50° C. to 100° C. depending on the barrier material used in the sandwich-memory-unit.
3. When the thickness of the single Sb- or Bi-phase film is 10 nm, due to the sandwiching effect, the crystallization temperature is raised at least 100° C. Moreover when the thickness is 5 nm the crystallization temperature is at least raised 130° C.
4. The single Sb- or Bi-phase film can be doped with solid-soluble elements whose contents are much larger than that of equilibrium concentration. This is specifically true at film thickness 15 nm and thinner. Such doping serves also to enhance crystallization of the single phase film at a substantial doping.
5. The volume change of the sandwiched single Sb- or Bi-phase film is less than 3% during phase change. This value is less than one third of the volume change (reported to be 9~9.5%) of the conventional phase-change memory material $Ge_2Sb_2Te_5$ during phase change.
6. The electrical resistance drifting after reset of the multi-layered phase-change memory device made of the single or multiple sandwich-memory-unit(s) is less than a half of the resistance drifting of the conventional phase-change memory. More generally the drift is less than one third that of devices made of $Ge_2Sb_2Te_5$ materials.

In the disclosure, the single element phase denotes doped single pure element which stays as single phase after being continuously heated to an elevated temperature (say 50° C. below its melting point) for a long time (say longer than 30 minutes). Since it contains a solute element inside, the single element phase is in fact a single element solid solution phase.

In the present invention, memory-layer is usually very thin (such as 5 nm) it can be completely disappeared if it interacts readily with surrounding materials. On the other hand, even if such a reaction is just slightly to deprive only a few atomic layers off memory film the resultant crystallization temperature of the memory film may vary greatly. Moreover, the volume change during phase change from amorphous phase to crystalline phase of the conventional phase-change $Ge_2Sb_2Te_5$ materials is as large as up to 9.5%. They suffer from the resultant reliability issues and a high risk of peeling and device broken after long-term cycling. To achieve plausible stability for archive storage at high-temperature as well as long-term cycling stability, three distinct points of the present invention which being different from prior arts are described as following.

1. Barrier layers are adopted to envelop each memory-layer which is hence separated from the electrode materials. Such a design constitutes the basic single or multiple sandwich-memory-unit(s). Four characteristics are required for a barrier-layer material: (a) it should be highly stable at high temperatures, at least up to 1000° C., (b) it does not chemically react with the memory-layer, (c) it does not physically react with the memory-layer, for instance diffusion between each other, (d) it can completely wet the memory-layer. The material of the barrier layer, which being compliant with the aforementioned characteristics, is intended to include within the appended claims. There are two categories of the barrier layer. One is electrically conductive barrier layer used when the sandwich-memory-units are connected in series with electrodes. The conductive barrier layer can be chosen from but not limited to tungsten, molybdenum, ruthenium, ruthenium oxide, titanium nitride, tantalum nitride, yttrium antimonide, hafnium antimonide, zirconium antimonide, or titanium antimonide. Another is the insulating barrier layers used when the sandwich-memory-units are stacked in parallel to the two electrodes. The insulating barrier can be chosen from but not limited to antimony oxide, silicon oxide, aluminum oxide, magnesium oxide, zirconium oxide, hafnium oxide, titanium oxide, aluminum nitride, silicon nitride, or silicon carbide. The material of each barrier layer in multiple sandwich-memory-units can be different.
2. The memory-layer in a sandwich-memory-unit is made of single Sb-phase or single Bi-phase as the phase-change material. The memory-layer in the sandwich-memory-unit is characteristic of increased crystallization temperature up to at least 50° C. when the thickness is reduced from 15 nm to 5 nm. The crystallization temperature of the sandwiched single Sb- or Bi-phase film with the thickness of 15 nm is higher than 100° C., which bestows the sandwichmemory-unit high-temperature stability for practical use. This is particularly true when the thickness of the memory-layer is reduced to 5 nm and thinner.

3. During the phase change between the crystalline and the amorphous phases, an absolute value of linear expansion of the single Sb- or Bi-phase as the phase-change material is less than 1%. This is equivalent to an absolute value of volume expansion less than 3%. In practice, one embodiment shows that the linear expansion of Sb-film is less than 0.3%; which is either the volume expansion of the un-doped Sb-film or the volume contraction of doped Sb-film. The doping concentration of doped elements is set within the solid solubility; accordingly, the doped atoms can exit stably in the lattice of Sb or Bi, forming single Sb- or Bi-phase. Therefore, when the volume change during the phase change between the amorphous and crystalline phases in the single Sb- or Bi-phase solid solution is less than 3%, the doped elements and the doping concentration are intended to include within the appended claims. In case that volume change of doped Sb- or Bi-phase is larger than 3%, this invention propose to dilute the volume of Sb- or Bi-phase by adding proper amount of inert nanoparticles. Therefore the addition of inert nanoparticles to reduce volume fraction of memory-layer is intended to include in the appended claims.

BRIEF DESCRIPTION OF THE DRAWINGS

FIG. 1 (A) illustrates one embodiment.

FIG. 15 (A) illustrates measurement results of electrical resistance drifting of a memory cell with 400 square nanometers comprising a 5 nm undoped Sb film as the memory-layer. After the memory cell is set and reset cycled for 5 times and is in the reset amorphous phase.

DETAILED DESCRIPTION OF THE INVENTION

The following disclosure demonstrates the structure, materials, kinds of doping elements in compliance with drawings and figures.

Structure of Multi-Layered Phase-Change Memory Device

Figures 1A, 1B:
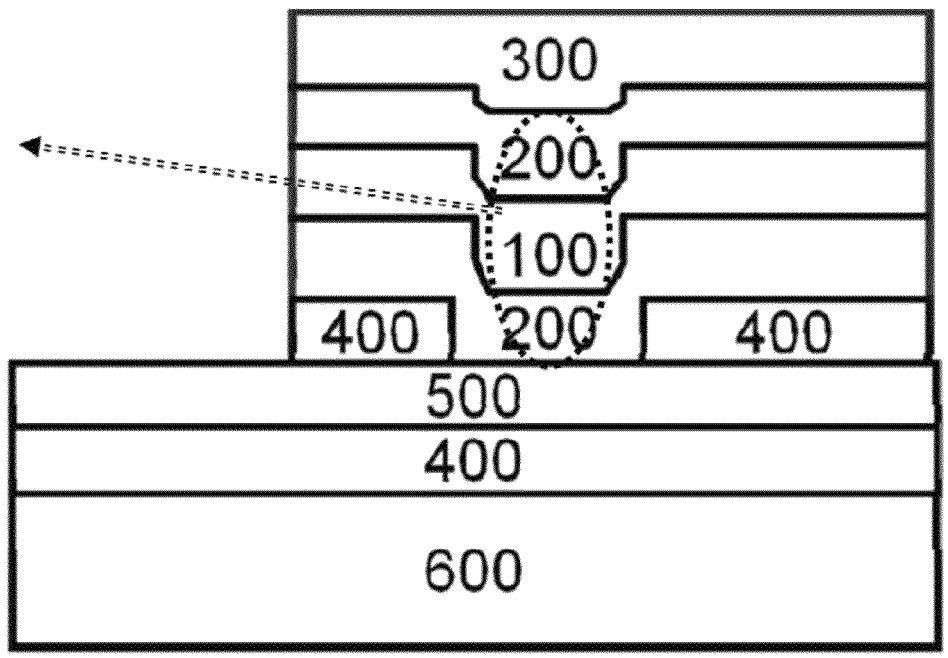
FIG. 1(B) illustrates a area circled by dotted line in FIG. 1 (A) representing a single sandwich-memory unit.
Figure 2:
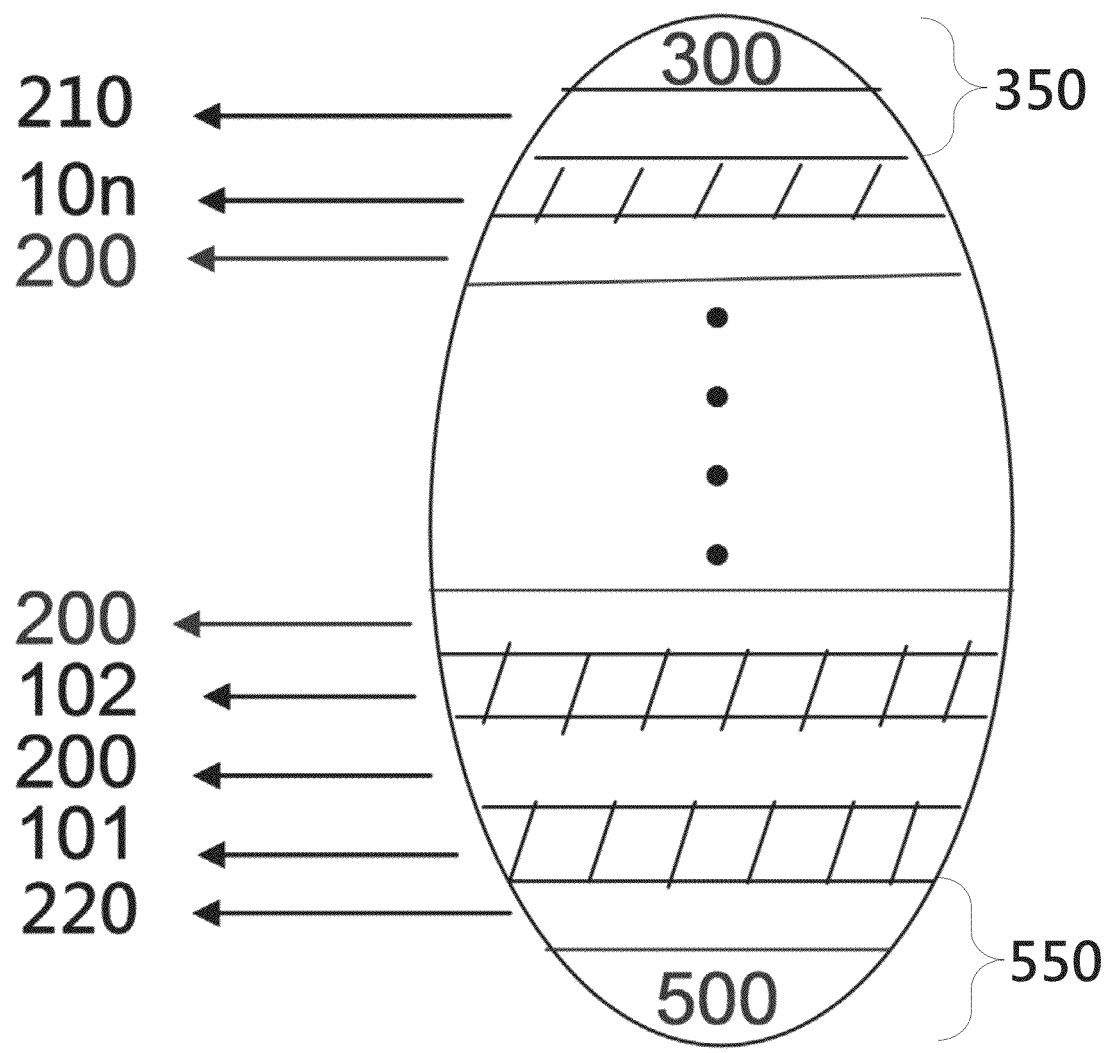
FIG. 2 illustrates multiple sandwich-memory units comprising a plurality of the single sandwich-memory unit shown in FIG. 1(B).

To attain the sandwiching effect, a memory-layer 100 in conjunction with electrical conductive barrier layers 200 or electrical insulating barrier layers 701 are deposited to constitute a three-layered structure. The sandwich structure is recognized as the barrier layer/memory-layer 100/barrier layer. FIG. 1(A) shows a single sandwich-memory-unit which is in the area circled by dotted line in FIG. 1(B). Multiple sandwich-memory-units are formed from a plurality of single sandwich-memory-unit, wherein the thickness of each memory-layer 100 can be different. Thickness of the barrier layer can be in a range of thinner than 30 nanometers (nm) or ranging from 30 nm to 100 nm depending on and confined to a geometrical shape of the device. Each memory device can comprise a single sandwich-memory-unit, two sandwich-memory-units, three sandwich-memory-units, . . . , to n sandwich-memory-units wherein n indicates a positive integer, as shown in FIG. 2. The single sandwich-memory-unit is responsible for a two-bit memory while multiple sandwich-memory-units for multi-level memory.

Figure 3:
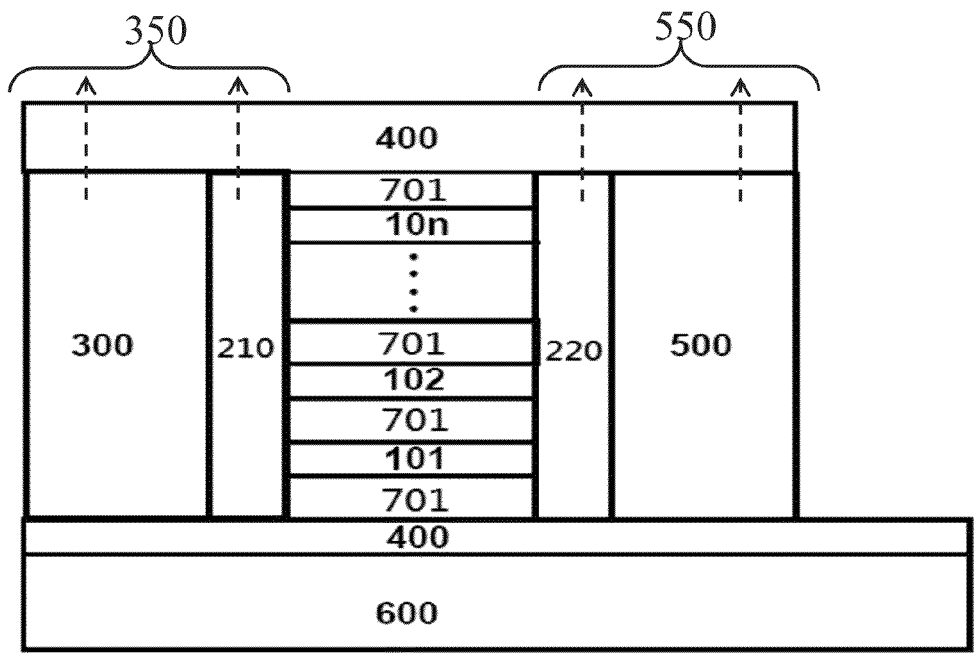
FIG. 3 illustrates the case of connection in parallel.

The present invention discloses two types of electrical connections which are connected in series and connected in parallel. The FIG. 1(A), FIG. 1(B), and FIG. 2 are the connection in series and the barrier layers inside are all conductive. The circled area by dotted line representing FIG. 1(B) illustrates the single sandwich-memory unit. In the FIG. 2 the circle-bounded area illustrates the multiple sandwich-memory units comprising a plurality of the single sandwich-memory unit. The multiple sandwich-memory units have each of their memory-layer 100 co-planar and are vertical to a flow direction of electrical current provided by a first electrode (top) 300 and a second electrode (bottom) 500. This is the case of series connection among the multiple sandwich-memory units. In the series arrangements of FIGS. 1 (A) and 2 electrodes (top and bottom) are in parallel to the memory-layers in the sandwich-memory-unit. In FIG. 2 and FIG. 3, the first and second memory-layer in the multiple sandwich-memory-units respectively denoted 101 and 102. FIG. 3 illustrates the case of connection in parallel. The barrier layer 701 used in the multiple sandwich-memory units is electrical insulating. The difference between FIG. 3 and FIG. 1 (A) is that in FIG. 3 the plane of each memory-layer 100 is parallel to the flow direction of electrical current provided by the first (left) electrode 300 and the second electrode (right) 500, which provides electrical connection among the multiple sandwich-memory units be connected in parallel. Between the multiple sandwich-memory-units and side electrodes, extra side barrier-layers 210 and 220, which are electrical conducting, are disposed of. In parallel configuration of FIG. 3 the electrodes are set to two sides of and perpendicular to the sandwich-memory-units. Furthermore, the first and second electrode assembly-layer denoted 350 and 550 respectively.

The Thickness, Material and Additives of the Memory-Layer 100

The present invention demonstrates the capability to promote performance of the multi-layered phase-change memory device by controlling the thickness, material, and additives of the memory-layer 100. The first issue needed to overcome is that one of the adopted material, antimony (Sb) element, will be spontaneously crystallized at room temperature giving rise to the failure to be used as the material of the memory-layer 100. Three strategies are required to solve the spontaneous crystallization: one is to deposit the Sb-film as a very thin film, the other to use a very low deposition rate, and the third the adoption of sandwiching effect meaning to envelop Sb-film with a top- and an under-layer.

The following disclosure demonstrates a relationship between the thickness of the memory-layer 100 and the crystallization temperature. Pure Sb element without being doped with other elements or without being added with nanoparticles is deposited on a substrate 600 whose surface has a layer of silicon dioxide ($SiO_2$) at 100 nm thickness. Before pure Sb element is deposited on the substrate 600, an electrode made of titanium nitride (TiN) for detecting resistance has previously been deposited on the substrate 600. After deposition, thicknesses of the Sb film are 3 nm, 5 nm, 7 nm, 10 nm, 15 nm, 50 nm, and 100 nm, respectively. The deposition rate is controlled at 0.33 nm per minute (nm/min). Moreover, on top of the Sb film, a 100 nm-thick protection layer made of silicon oxide (SiOx) is covered, forming a sandwiched three-layer-structural unit of TiN/Sb-film/SiOx. The TiN and SiOx serve as the barrier-layer of concern.

Figure 4:
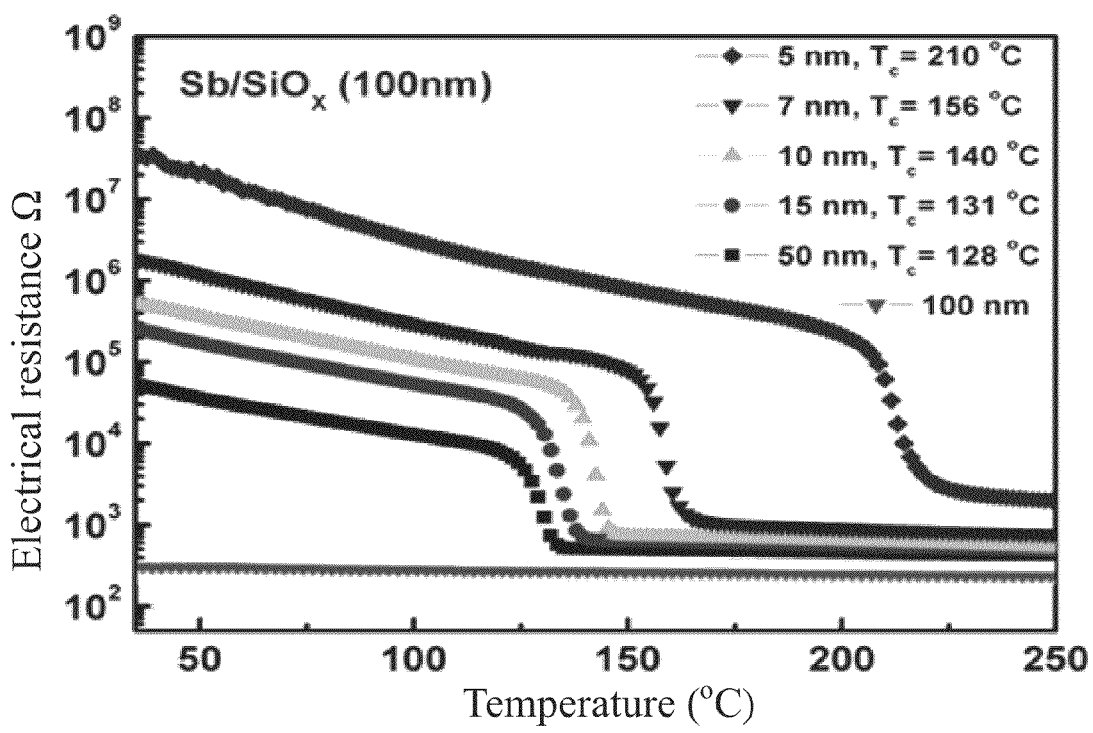
FIG. 4 illustrates the change of electrical resistance versus ramping temperature as the thickness of the Sb film gradually decreased from 100 nm to 5 nm.

FIG. 4 illustrates the change of electrical resistance ($\Omega$) versus ramping temperature as the Sb film with aforementioned thickness is heated at a heating rate of 10° C. per minute (° C./min). The crystallization temperature (Tc) is determined by the rapid drop in resistance ($\Omega$) versus temperature. There is an increasing trend of the Tc with gradually decreased thickness of the Sb film.

The Sb film, 50 nm to 15 nm being deposited at 0.33 nm/min and sandwiched between silicon dioxide ($SiO_2$) and TiN comprises of nano-crystalline Sb embedded in the amorphous matrix as analyzed by X-ray diffraction. Accordingly, the 50 nm Sb-film has a medium high electrical resistance, while the 15 nm Sb-film has a very high electrical resistance in compliance with the high amount of amorphous matrix phase in the latter case. In the heating process, electrical resistance switches from high resistance state to low resistance state for all studied films except that of 100 nm films. This depicts the crystallization behavior of the matrix amorphous phase. Meanwhile, the crystallization temperature Tc of the Sb film from 50 nm to 15 nm is between 128° C. and 131° C., which are almost unvaried considering experimental errors. The crystallization temperature being too low, the 15 to 50 nm-thick Sb film though has the ability for phase change application is unsatisfactory in thermal stability of data storing. When the thickness of the Sb film sandwiched in between $SiO_2$ and TiN is with the thickness of 100 nm, no matter how slow the deposition rate is, electrical resistance of as-deposited film is in a low resistance state as same as a Sb bulk material. In the heating process there is no switch from the high resistance state to the low resistance state and the as-deposited state of the Sb film analyzed by the X-ray diffraction is completed crystalline. Therefore, the Sb film with 100 nm cannot be usable as phase-change material.

If the deposition rate is increased to 1 nm/min, the sandwiched 50 nm Sb-film is completely crystallized after deposition. If the deposition rate is increased to 3 nm/min, the sandwiched 20-nm Sb-film is completely crystallized; and the Sb film with 15 to 10 nm thickness comprises a small amount of nanocrystalline Sb phase. Accordingly, the control of the deposition rate is one of the key points in the present invention.

Figure 5:
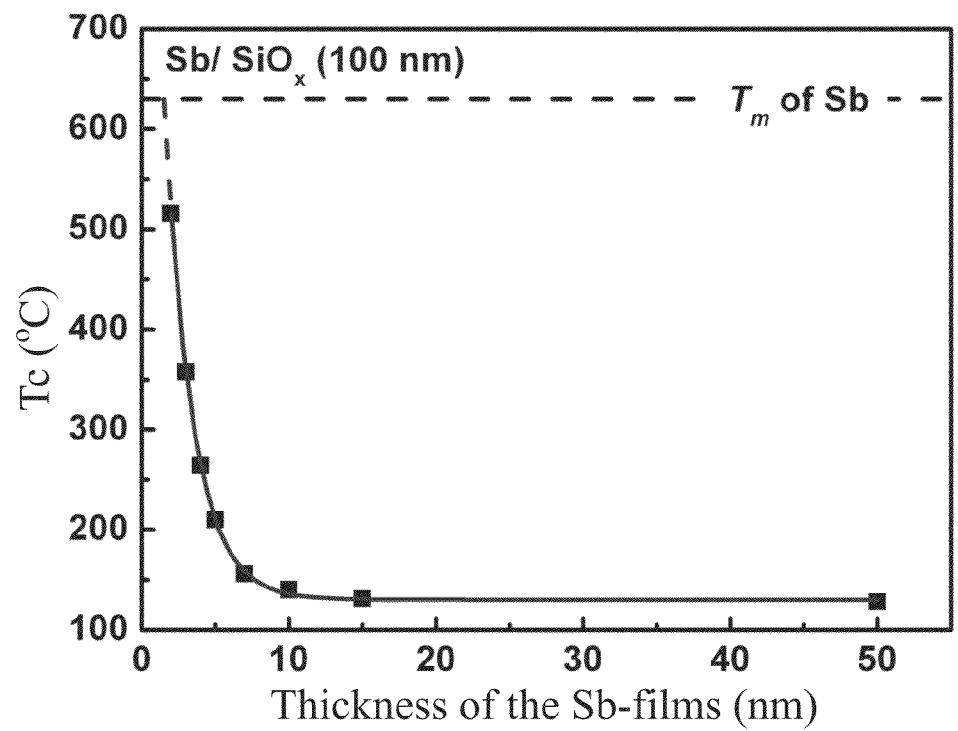
FIG. 5 illustrates the crystallization temperature versus thickness of undoped Sb films.

FIG. 5 illustrates the crystallization temperature (Tc, ° C.) versus thickness of Sb-films. Tc exponentially ramps up as film thickness is decreased from 15 nm to 3 nm. Tm represents melting point of the Sb element and the Tc means the crystallization temperature (° C.). When the thickness of the undoped Sb film is decreased from 15 nm to 7 nm, 5 nm and 3 nm, Tc is raised from 130° C. to 157° C., 210° C. and 358° C., respectively. An exponential function can be fitted to illustrate the relationship between Tc and the thickness (d, in nm) of the Sb film the as following:

$$Tc = T_0 + C\exp(-d/d_0) \quad (1)$$

Where the Tc means the crystallization temperature (in degree Kelvin); d represents the thickness of the Sb film; $T_0$ and $d_0$ represent constants relating to the temperature and thickness, and C a proportional constant. The best fit values are C equivalent to 1150 K, $T_0$ equivalent to 403 K, and $d_0$ equivalent to 1.90 nm. One has to keep in mind that these constants are obtained under the three strategies adopted to prepare the Sb-films of disclosure.

Figure 6A:
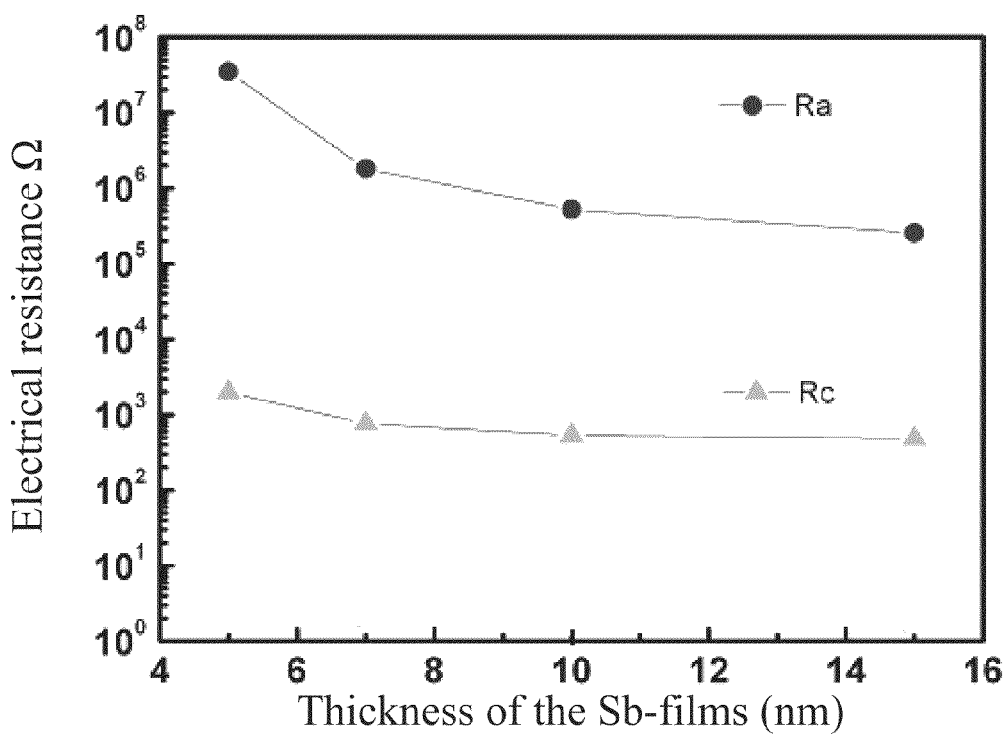
FIG. 6(A) illustrates the electrical resistance of the amorphous phase (Ra) and electrical resistance of the crystalline phase (Rc) as the Sb-film thickness is gradually decreased from 15 nm to 5 nm.
Figure 6B:
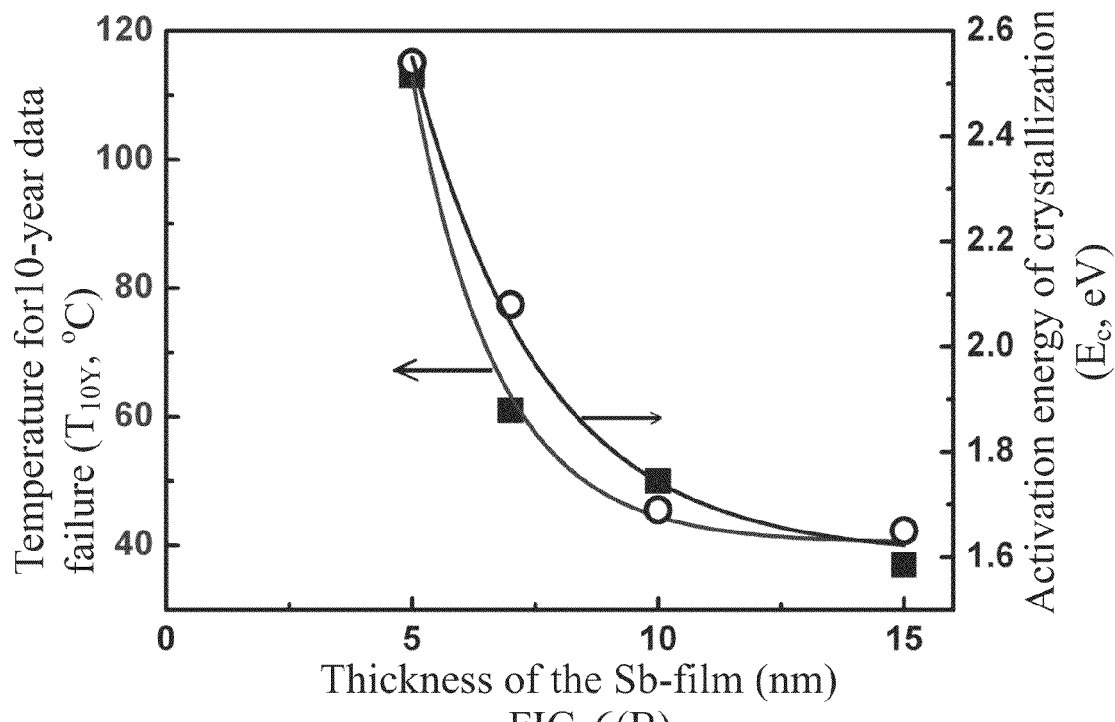
FIG. 6(B) illustrates activation energy of crystallization ($E_c$) and the temperature corresponding to 10-year data failure ($T_{10Y}$) as the Sb-film thickness is gradually decreased from 15 nm to 5 nm. Tc, Ra, Rc, Ec, and $T_{10Y}$ are all raised exponentially with decreasing Sb-thickness.

FIGS. 6 (A) and (B) illustrates as a function of Sb-film thickness the crystallization temperature, electrical resistance of the amorphous phase (Ra, in $\Omega$), and electrical resistance of the crystalline phase (Rc, in $\Omega$) which are all obtained from FIG. 4 and FIG. 5. Moreover, based on thermodynamic analysis activation energy of crystallization ($E_c$, in eV) and the temperature corresponding to 10-year data failure ($T_{10Y}$, in ° C.) can be obtained as the Sb-film thickness is gradually decreased from 15 nm to 2 nm. Not only Tc, Ra, Rc, Ec, and $T_{10Y}$ are all raised exponentially with decreasing Sb-thickness. All the above data are summarized in Table 1 which demonstrates that by the controlling the thickness of the memory-layer 100 which is sandwiched between TiN and SiO2, the crystallization temperature (Tc, ° C.), the resistance of amorphous phase (Ra, $\Omega$), the resistance of crystalline phase (Rc, Ω), the activation energy of crystallization (Ec, eV) and the temperature for 10-year data failure ($T_{10Y}$, ° C.) can be properly adjusted and raised in the present invention. Table 1 further illustrates that the increase in crystallization temperature (Tc, ° C.) due to decreased thickness is not a meta-stable status but are thermodynamically stable. With decreased thickness, the activation energy of crystallization (Ec) is exponentially raised from 1.62 eV (15 nm) to 2.96 eV (3 nm). Electrical resistance of the amorphous phase (Ra) is exponentially raised from 30.7 kΩ (15 nm) to 485 MΩ (3 nm). Electrical resistance of the crystalline phase (Rc) is exponentially raised from 494Ω (15 nm) to 8.49 kΩ (3 nm). The temperature for 10-year data failure ($T_{10Y}$) is exponentially raised from 31° C. (15 nm) to 204° C. (3 nm). All these data provide much room for the memory-cell designers to choose a proper thickness for the memory-layer 100. This is one major difference in non-obviousness and utility of the present invention from those of the known inventions. From the aforementioned disclosure, it is learned that the crystallization temperature (Tc) can be raised by decreasing film thickness which is slowly deposited and sandwiched. Accordingly, a chance for a brand new single element material can be utilized. The present invention also discloses a benchmark that the sandwiched 5 nm-Sb-film has a crystallization temperature (Tc) as high as 210° C. and the temperature for 10-year data failure ($T_{10Y}$) is 103° C. Such a film is readily applicable in phase-change memory. The 5 nm thickness is successful to avoid the reliability issue caused by too thin a thickness such as thinner than 2 nm in an old disclosure.

In Table 1, the crystallization temperature (Tc), the activation energy of crystallization (Ec), electrical resistance of the amorphous phase (Ra), electrical resistance of the crystalline phase (Rc), and the temperature for 10-year data failure ($T_{10Y}$) of un-doped Sb film which is deposited to be sandwiched between TiN and SiOx layers forming the sandwiched three-layered structure TiN/Sb-film/SiOx; G, M, K, representing billion, million, and thousand, respectively.

TABLE 1

| Thickness (nm) | Tc (° C.) | Ec (eV) | Ra | Rc | $T_{10Y}$ (° C.) |
|---|---|---|---|---|---|
| 2 | 515 | 3.43 | 1.81 GΩ | 19.1 kΩ | 300 |
| 3 | 358 | 2.96 | 485 MΩ | 8.49 kΩ | 204 |
| 4 | 264 | 2.62 | 130 MΩ | 3.93 kΩ | 142 |
| 5 | 210 | 2.36 | 35 MΩ | 1.97 kΩ | 103 |
| 6 | 176 | 2.16 | 9.43 MΩ | 1.13 kΩ | 77 |
| 7 | 157 | 2.02 | 2.55 MΩ | 768 Ω | 60 |
| 8 | 146 | 1.91 | 708 kΩ | 618 Ω | 50 |
| 10 | 136 | 1.76 | 79.5 kΩ | 516 Ω | 39 |
| 15 | 130 | 1.62 | 30.7 kΩ | 494 Ω | 31 |

Volume Change of the Memory-Layer 100 after Phase Change

Figure 7:
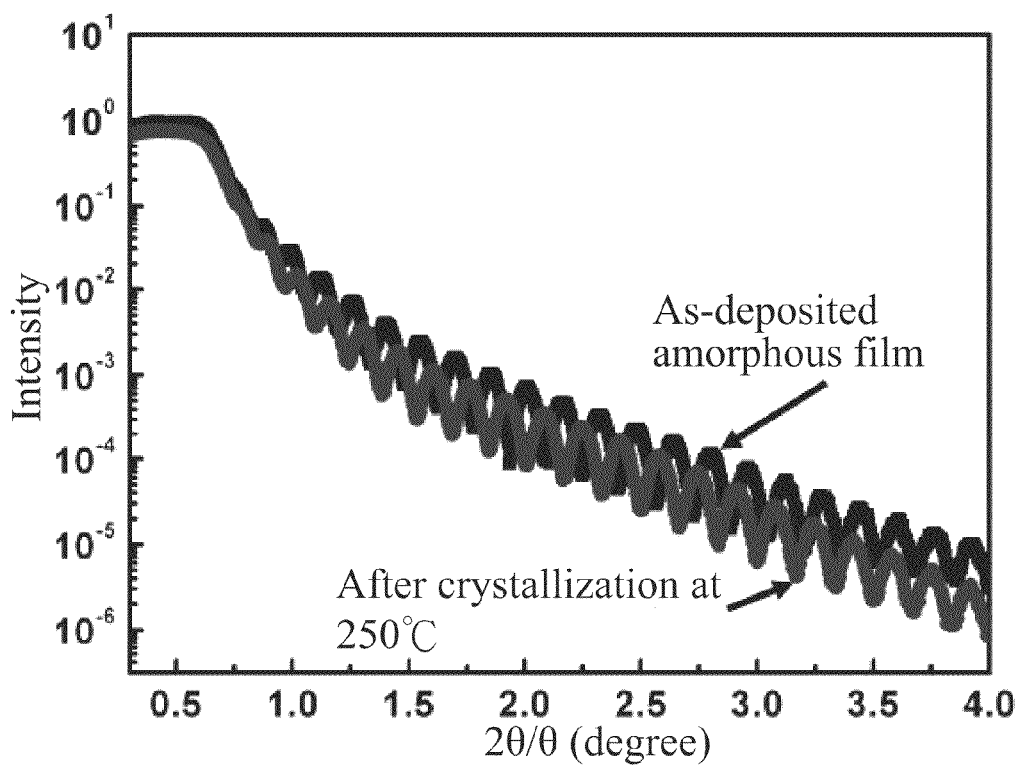
FIG. 7 illustrates reflectivity of the undoped Sb film with the thickness of 50 nm and deposited at a rate slower than 0.33 nm/min measured by X-ray Reflectivity (XRR). The as-deposited state of such a Sb film is proved to be in complete amorphous phase by X-ray diffraction. It is in complete crystalline phase after being heated for 3 minutes at 210° C. Densities of the Sb films can be measured by XRR.

The volume change from the amorphous phase to crystalline phase of the undoped Sb film is measured by X-ray Reflectivity (XRR). The volume change can be calculated by measured reflectivity as shown in FIG. 7. In FIG. 7, the undoped Sb film with the thickness of 50 nm without a cover layer is deposited at a rate slower than 0.33 nm/min cautiously. Thereafter, the as-deposited state of such a Sb film is proved to be in complete amorphous phase by X-ray diffraction. It is in complete crystalline phase after being heated for 3 minutes at 210° C. Densities of the amorphous and the crystalline phases of the film are 6.60 g/cm$^3$ and 6.63 g/cm$^3$ respectively, which means the volume change during phase change is 0.45%, in compliance with one of the key characteristics of the present invention.

A 50 nm thick Ge$_2$Sb$_2$Te$_5$ amorphous film is also deposited, crystallized, and analyzed by the XRR to make a comparison. The measured volume change of the Ge$_2$Sb$_2$Te$_5$ film reaches 8.9% which, though a little smaller than the reported 9.5%, is 20 times that of the amorphous Sb-film. This means that operation stability and long-term cyclability of the device is greatly improved over the past arts. When a Sb film or Bi film is doped with another element within solid solubility into a single Sb-phase or a single Bi-phase film, or it is added with inert nanoparticles, a relationship between the volume change and doping concentration can be screened by the XRR method. The ones whose volume change being less than 3%, better less than 2%, can be selected. This complies with the one of the key characteristics of the present invention.

Effects of Doping to the Memory-Layer 100 in a Single-Element-Phase State

The present invention further discloses that the memory-layer 100 can be doped with other elements within solid solubility, which means the material maintains as a single-element-phase, the performance of the device can be tuned and enhanced.

For easier description in this disclosure, a notation with the symbol Sb(M) represents the doped M element whose doping concentration is expressed as the subscript. For instance Sb($C_{1 at \%}$) means a Sb-film being doped with 1 at % C, and Sb(Ga8 at %) means a Sb-film being doped with 8 at % Ga. In most cases the Sb(M) also represents an M-element containing single Sb-phase solid-solution when M content is within the limit of solid solubility and M atom fully enters Sb-lattice. This is so-called a single-element-phase. In the same manner, single element phases formed by doping with oxygen, doped with phosphorus, and doped with nickel are denoted Sb(O), Sb(P), and Sb(Ni), respectively. However, in the preparation process of a film or a device, it is inevitable that trace amount of oxygen or carbon, from the deposition chamber, can contaminate deposited films giving rise to the formation of solid solution. In this circumstance, it is not denoted as Sb(O) to distinguish from that purposely doped with Oxygen.

To those who are skilled in material science and in electronic techniques know that pure element or pure phase differs each other in different degrees of purity. For example, metallurgical silicon represents content of silicon is 98 to 99 wt %. Solar grade silicon represents the content of silicon is above 99.9999 wt % (six-nines). While purity of semiconductor grade silicon reaches nine-nines purity. One gram of the nine-nines purity silicon equivalent to 0.0357 mole and 2.15× 10$^{22}$ silicon atoms comprises more than 2.15×10$^{15}$ (215 trillion) impure atoms. This number of impure atoms in the very pure (nine-nines) is numerous. Those who are skilled in this art know that both the solar grade silicon and the semiconductor grade silicon can be proportionally doped with specific impure atoms in the process to adjust its electrical performance. For instance, the doping with boron (B) will result in P-type semiconductor and the doping with phosphorus (P) N-type semiconductor.

In the present invention, the pure Sb (or pure Bi) represents the Sb (or Bi) without being purposely doped with other elements. However, it can contain inevitable impurities, for instance, oxygen incorporated during processing. The single Sb- or Bi-phase represents pure Sb or Bi being doped with other elements whose content is within solubility limit inside Sb- or Bi-film. So that the doped elements can be dissolved into the pure Sb- or Bi-lattice forming homogenous single Sb- or Bi-solid-solution phase. No second phases or other mixtures can be detected. The single Sb (or Bi) phase solid solution is distinctively different from the mixture phases formed after being over-doped. The atoms of former occupy the lattice points or inside interstitial void of the Sb (or Bi) lattice and are unable to be differentiated from the Sb (or Bi) atoms. The later usually yields precipitates.

In case of bulk material a phase diagram can be referred to extract the extent of solubility limit. However, in case of a film the solid solubility can be greatly increased specifically in case of very thin films. For instance, the phase diagram demonstrates that Sb and Bi elements are completely soluble in each other either in a solid state or in a liquid state. The maximum solid solubility of P in Sb is 0.06 at % in phase diagram. At an equilibrium state, as the concentration of P in Sb is over 0.06 at %, P is going to be precipitated, forming a mixture of P and Sb. The maximum solid solubility of Ni in Sb is 0.2 at % according to phase diagram. In the equilibrium state, if concentration of the Ni is over 0.2 at %, nickel diantimonide ($NiSb_2$) is precipitated forming a mixture of Sb and $NiSb_2$. The maximum solid solubility of Tellurium (Te) element in Sb is 1.3 at % according to phase diagram. At the equilibrium state, if concentration of Te is over 1.3 at %, a delta Sb—Te phase is going to be precipitated, forming a mixture of Sb and delta Sb—Te. However, in the film state, the aforementioned solid solubility can be two-times to ten-times increased mainly because thin films are not in the equilibrated state; instead they are in the meta-stable state.

One needs to carry out experiments to determine whether the content of doped elements does dissolved into the Sb- or Bi-lattice of the Sb- or Bi-film. First, the doped film is heated to a temperature which is 80% to 90% that of the absolute melting temperature and soaking for a while, say 3 to 10 minutes. For instance, the melting temperature of Sb is 920 K, the doped Sb-film is heated to 773 K (500° C.) and soaking for 10 minutes. A second phase will be precipitated if the doping content exceeds solid solubility. Second, by X-ray diffraction analysis, whether there are precipitates can be determined. The doped Sb-film without any precipitates represents that the doped element is really dissolved in the Sb-lattice of the Sb film. Moreover, peak positions in X-ray diffraction can also be studied and lattice constants can be calculated thereof. By the extent of lattice expansion the solid solubility can be determined. Other material analysis methods comprising of Raman spectroscopy and X-ray photoelectron spectroscopy are used to analyze bonding situation for more detailed understanding of the dissolved element.

The following illustrates the sandwiched three-layered structure: TiN/Sb-film/SiOx wherein the Sb film is further doped with a small amount of, for example, carbon, Sb(C); gallium, Sb(Ga); aluminum, Sb(Al); titanium, Sb(Ti); copper, Sb(Cu); tantalum, Sb(Ta); boron Sb(B); silicon Sb(Si); nitrogen Sb(N); or tungsten Sb(W), respectively. The relationship between the solid solubility of these doping elements versus the thickness of the Sb film is determined. The aforementioned doping elements are just arbitrarily taking as examples not as a limitation of doping elements. Any doping elements able to dissolve in Sb or Bi film and to enhance device performance are intended to be included in the claims.

Figure 8A:
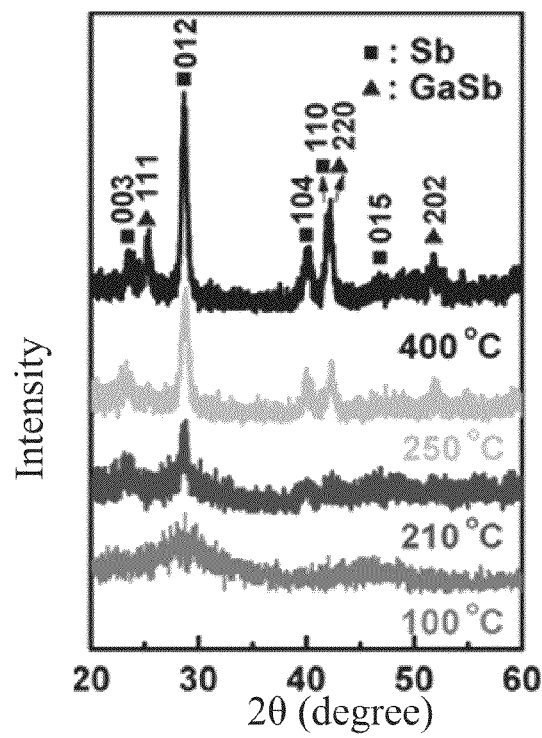
FIG. 8(A) illustrates a 100 nm Sb-film doped with 16 at % Ga measured by grazing incidence X-ray diffraction after being heated at 100° C. to 400° C. for three minutes.
Figure 8B:
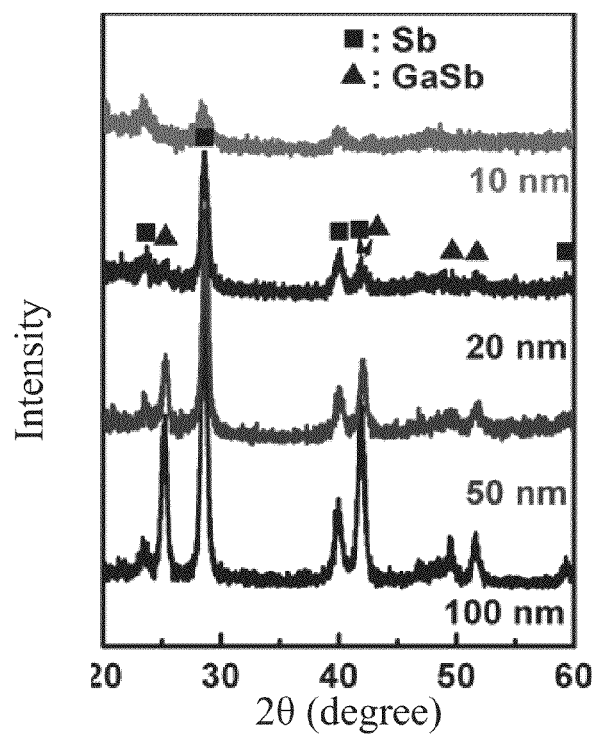
FIG. 8(B) illustrates the 100 nm Sb-films doped with 16 at % Ga with thickness of 50 nm, 20 nm and 10 nm measured by grazing incidence X-ray diffraction after being heated at 500° C. for 3 minutes.

First, Sb-films doped with Ga are disclosed. A 100 nm-Sb-film doped with 16 at % Ga is deposited. Grazing incidence X-ray diffraction is carried out after the doped Sb-film being deposited and after being heated at 100° C. to 400° C. for three minutes, respectively. The result is shown in FIG. 8(A). Doping a large amount of Ga helps to stabilize the amorphous phase of the as-deposited Sb film. Accordingly, after being deposited, the doped Sb-film at the thickness of 100 nm keeps amorphous phase. This behavior is quite different from that of pure Sb film. After the Ga-doped Sb-film being crystallized by heating at a temperature higher than 210° C., peaks representing a second phase of gallium antimonide (GaSb) are evident alongside with peaks of Sb-phase. Moreover, the intensity of the second phase GaSb increases with increasing heating temperature. Therefore, it can be determined that 16 at % Ga exceed the solid solubility in the crystalline phase of the 100 nm Sb-film. Thereafter, film thickness of the Sb film doped with 16 at % Ga is decreased to 50 nm, 20 nm and 10 nm, respectively. The Ga doped Sb-films with different thickness are heated at 500° C. for 3 minutes. The grazing incidence X-ray diffraction is carried out and the result is shown in FIG. 8(B). The peak intensity of the second GaSb phase decreases with decreasing thickness. When the thickness reaches 10 nm, the second GaSb phase disappears. The only peak left is the single Sb-phase. This demonstrates that the solid solubility of Ga in the 10 nm-Sb-film reaches 16 at %.

Furthermore, the radius of Ga atom is 0.136 nm which is very close to the radius of Sb atom, 0.133 nm. When Ga atom enters the crystal lattice of Sb, it replaces Sb-positions in the lattice point. Although the doping concentration of Ga is rather large, the volume change of the Sb film is little. The present invention discloses that even though the Ga doping concentration is as high as 12 at % the volume-change during phase change is smaller than 3% if the added Ga atoms are dissolved in Sb-film. Only a single Sb-phase appears after heating at 500° C. for 3 minutes. Volume of pure Ga-metal, pure Sb-metal, pure Si-metal, pure Ge-metal and pure Bi-metal expands upon solidification from their liquid state, similar to the freezing of water. These elements are unique in such a character among all other elements.

100 nm Sb films doped with 0 at %, 3 at %, 5 at %, 8 at %, and 10 at % C are deposited. The change in electrical resistance upon heating of the C-doped Sb-films is measured. The undoped Sb-film crystallizes at room temperature and is always at a low electrical resistance state during heating up. However, Sb films doped with 3 at % C and more keeps at high electrical resistance at the as-deposited state; and the electrical resistance declines gradually upon heating up then rapidly when the temperature is close to the crystallization temperature. This is a typical character of the phase-change material.

Figure 9A:
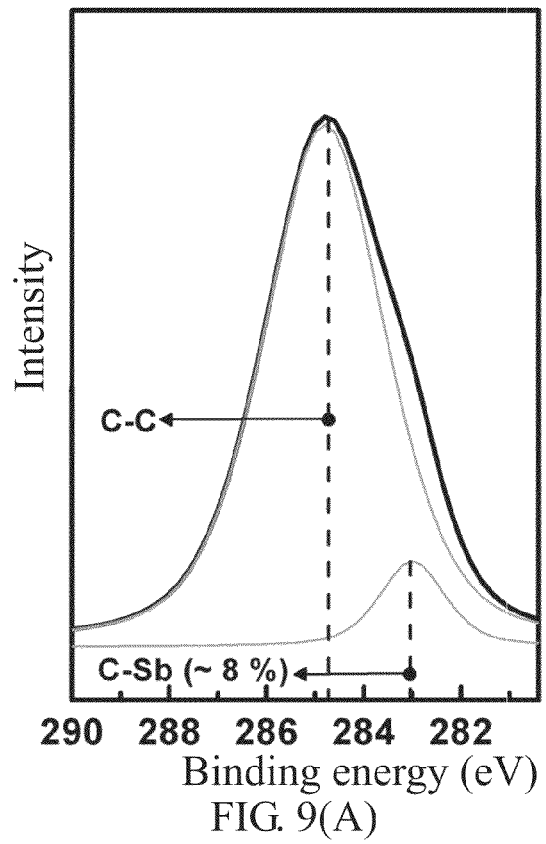
FIG. 9(A) illustrates as as-deposited Sb film doped with 8 at % C analyzed by X-ray photo-electron spectroscopy. Two curves under the energy spectrum indicate peaks of C—C chemical bond (C—C) and C—Sb chemical bond (C—Sb) respectively.
Figure 9B:
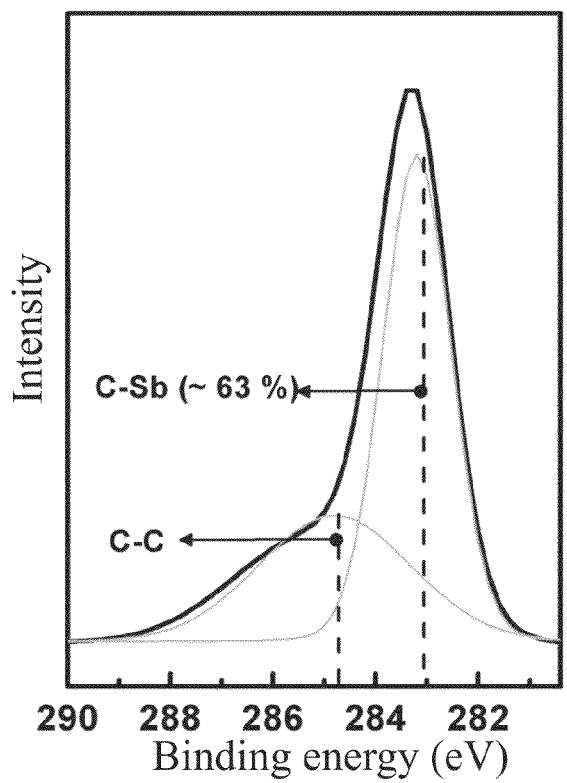
FIG. 9(B) illustrates the sb film doped with 8 at % C is analyzed by X-ray photo-electron spectroscopy after being heated at 300° C. Two curves under the energy spectrum indicate peaks of C—C chemical bond (C—C) and C—Sb chemical bond (C—Sb) respectively.

A change in C—C chemical bonds and C—Sb chemical bonds before and after crystallization is analyzed by X-ray photo-electron spectroscopy. It can be estimated that the solid solubility of carbon in Sb is 5 at % when the thickness of the Sb film is 100 nm as shown in FIG. 9(A) and FIG. 9(B). As the 50 nm and 100 nm Sb films are doped with 5 at % carbon, the resultant Sb films are amorphous at room temperature. After they are heated at 250° C. for 10 minutes, these Sb films become single crystalline Sb phase which contains 5 at % carbon. The present invention further uncovers that as the thickness of the Sb film is reduced to be 10 nm and thinner, the solid solubility of carbon in Sb lattice is greatly raised. For instance, as the thickness is 10 nm, the solid solubility of carbon is raised to 8 at %, and when the thickness is 5 nm, the solid solubility reaches 10 at %. The present invention further discloses that as the solid solubility of carbon is over 8 at %, the volume change during phase change is larger than 3%. It is safer to keep carbon doping content to 5 at % and less in order to maintain a volume change of smaller than 3%. Those who are skilled in the art can control the volume change during phase change by adjusting the doping concentrations of carbon in Sb- or Bi-film.

In addition, 10 nm-Sb-films are doped with 2 at %, 4 at %, and 6 at % boron (B), aluminum (Al), silicon (Si), nitrogen (N), germanium (Ge), copper (Cu), titanium (Ti), tantalum (Ta), tungsten (W), or tellurium (Te), respectively, using co-sputtering. The doping concentration is controlled by sputtering power of each target. The Sb-films at 10 nm are also doped with phosphorus (P) or oxygen (O) with the doping concentration of 2 at %, 4 at %, or 6 at % by ion implantation. After being doped, each Sb-film is amorphous as confirmed by grazing incidence X-ray diffraction. After heating the doped Sb-films for 10 minutes at 500° C. the grazing incidence X-ray diffraction is carried out a second time to check whether a second phase exits. The results demonstrate that after heating differences occur in Sb-films with different doping.

Table 2 illustrates the 10 nm-Sb-films doped with aforementioned elements. After being heated at 500° C. for 10 minutes, they are analyzed by the grazing incidence X-ray diffraction. The mark V represents a second phase is found exiting, while the mark X represents no second phase is found.

TABLE 2

| Doping concentration | Doping Element | | | | | | | | | | | |
|---|---|---|---|---|---|---|---|---|---|---|---|---|
| | B | Al | Si | N | Ge | Cu | Ti | Ta | W | Te | P | O |
| 2 ± 0.2 at % | X | X | X | X | X | X | X | X | X | X | X | X |
| 4 ± 0.4 at % | X | X | X | V | X | V | V | V | V | X | V | V |
| 6 ± 0.5 at % | V | V | X | V | V | V | V | V | V | V | V | V |

It is learned from the Table 2 that the solid solubility of each element in the Sb film with 10 nm can be approximated to be at least 2 at %. By further analysis, the solid solubility of N or O is 1.5 at %. The solid solubility of B, Al, or Te in the 10 nm-Sb-film is at least 4 at %; and the solid solubility of Si or Ge in the 10 nm-Sb-film is at least 6 at %.

In the aforementioned doping elements in Sb, those most in compliance with the key characteristics of the present invention are Ga, C, Ge, Si, Bi, N, and O. For the doping elements in Bi-film, better choices are Sb, Ge, Si, and Ga; in addition, C, N, and O also can be chosen.

Disclosed herewith are single or multiple single sandwich-memory-unit(s) wherein the memory-layers 100 are the single Sb-phase film doped with C or as the single-Sb phase film doped with Ga. It is demonstrated that electrical resistance of amorphous phase (Ra), electrical resistance of crystalline phase (Rc), the activation energy of crystallization (Ec), and the temperature for 10-year data failure ($T_{10Y}$) can be all exponentially increased with decreasing film thickness under the sandwich status.

First, Sb-targets with proper C-doping or Ga-doping are prepared for film deposition. Thereafter, films are deposited by direct current (DC) sputtering at the rate of 0.33 nm/minute. After deposition, the doped Sb films are covered with the barrier layer made of $SiO_x$ with the thickness of 100 nm. As shown in Table 3, the crystallization temperature of Sb films doped with C, Sb(C), or doped with Ga, Sb(Ga), also exponentially increases with decreasing film thickness. The crystallization temperature of the amorphous Sb films doped with 3 at % C, 5 at % C, and 8 at % C, respectively, is greatly raised with decreasing thickness and with increasing doping concentration of C. Moreover, the raising extent due to doping C is greater than that due to decreasing thickness at the same doping level. When the thickness of undoped Sb films is decreased from 15 nm to 5 nm, the crystallization temperature is raised from 130° C. to 210° C., an 8° C. raising extent per nm decrease. The crystallization temperature of the Sb film doped with 5 at % C and at 15 nm is 225° C. which becomes 280° C. when the thickness is decreased to 5 nm. The crystallization temperature increase 11° C. per at % C added. By doping Ga also has the effect of raising crystallization temperature of the doped Sb film. At the same doping concentration of 5 at % Ga and when the thickness is decreased from 15 nm to 5 nm, the crystallization temperature of the doped Sb-films raises from 160° C. to 218° C., a total of 58° C. raising extent. Moreover, Table 3 also depicts that the raised crystallization temperature (Tc) due to the decreasing thickness of the Sb-film is greater than that of $Ge_2Sb_2Te_5$. As the thickness of the latter is decreased from 15 nm to 5 nm, the crystallization temperature is just raised from 167° C. to 190° C., a 23° C. raising extent. When Sb-films with thickness of 15 nm, 10 nm, and 5 nm, respectively, are doped with 5 at % Ga, the crystallization temperature of the resultant Sb-films is 180° C., 195° C., and 230° C., respectively.

Table 3 illustrates the relationship among the crystallization temperature (Tc, ° C.), the thickness of the Sb film, and the doping concentration. Deposited on $SiO_2$/Si substrate are un-doped Sb-film, C-doped Sb-film Sb(C), Ga-doped Sb-film Sb(Ga), and $Ge_2Sb_2Te_5$ which is a control for comparison. On top of each film a barrier layer $SiO_2$ of 100 nm thickness is deposited to complete the sandwich. This constitutes a three-layered sandwich-memory-unit.

TABLE 3

| Thickness Tc or doping content | Material | | | | | | | |
|---|---|---|---|---|---|---|---|---|
| | Sb | $Ge_2Sb_2Te_5$ | Tc of Sb(C) (° C.) | | | Tc of Sb(Ga) (° C.) | | |
| | Tc (° C.) | Tc (° C.) | 3% C | 5% C | 8% C | 5% Ga | 12% Ga | 16% Ga |
| 5 | 210 | 190 | 245 | 280 | 312 | 218 | 230 | 268 |
| 10 | 136 | 170 | 203 | 243 | 283 | 165 | 195 | 236 |
| 15 | 130 | 167 | 185 | 225 | 260 | 160 | 180 | — |

Moreover, an extra benefit is obtained via doping to promote greatly the operating speed of the phase-change memory device. A full-set programming time for the pure Sb film without doping is between 5000 nanosecond (ns) and 100 ns; a full-reset programing time is between 500 ns and 40 ns. However, the cycling lifespan of the undoped Sb-film is not so endurable, usually less than a hundred thousand cycles. After the Sb film is doped with a little concentration of other elements (for instance C or Ga) the operation speed of the resultant device can be highly enhanced. For instance, the set and reset can be 20 ns and the cycling lifespan can be millions of cycles by C or Ga doping. In addition, proper doping can effectively raise the temperature for 10-year data failure ($T_{10Y}$). At 5 nm thickness, crystallization temperature is 103° C. for undoped Sb films while 115° C. for 5 at %-Ga doped film, and 145° C. for 5 at %-C doped film. This means that doping with a small concentration can effectively raise thermal stability of the amorphous Sb film, wherein the one doped with C is with better effect than that doped with Ga.

The present invention further discloses the effect of adding in the memory-layer 100 inert nanoparticles which are not interacting with the single element phase and are stable to high temperature at least 1000° C. The function of adding such inert nanoparticles is not similar to the case of $Ge_2Sb_2Te_5$ which is doped with oxides or nitrides aiming to increase crystallization temperature. In earlier researches, the crystallization temperature (Tc) of the $Ge_2Sb_2Te_5$ doped with oxides and nitrides can be raised 50 to 100° C. Nevertheless, the sandwiching effect and the thickness adjustment, for instance, 15 nm to 5 nm, can already raise the crystallization temperature (Tc) up to a range from 50 to 100° C., which is equivalent to the effect of adding the inert nanoparticles.

The following illustrates two purposes of adding the inert nano-particles. The first is to increase electrical resistance of the film after crystallization. By adding proper inert nanoparticles, electrical resistance of the memory-layer 100 in the crystalline phase can be adjusted to a value between 5 KΩ and 90 KΩ, according to requirements from integrated circuit design. The second purpose is to reduce the effective metal volume of the memory-layer 100. This will lead to a reduced volume change during phase change between the amorphous and the crystalline phases. Taking as one example, the original volume change of the Sb(Ga$_{16\,at\,\%}$) film is 4%. However, as an inert nanoparticles, such as Al$_2$O$_3$, which accounts for 30 mole % of the memory-layer 100, the volume change can be around 2.8%. This is in compliance with the key characteristics of the present invention. Accordingly, characteristics of the memory-layer 100 can be maintained for long-term cyclability. The reliability of such phase-change memory device can be much promoted.

The content of inert nanoparticles is better between 3 and 50 mole percent (mol %), which can be adjusted depending on requirements for the decrease of volume change. The inert nanoparticles should be evenly distributed in the memory-layer 100 and the size of them should not be larger than the thickness of the memory-layer 100. The entire memory-layer 100 becomes a granular thin film. The inert nanoparticles should not interact with the single element phase and are stable to high temperature at least 1000° C. Examples of such nanoparticles are oxides which can be silicon oxide, aluminum oxide, titanium oxide, antimony oxide, zirconium oxide, or hafnium oxide. They can be nitrides such as silicon nitride, boron nitride or aluminum nitride. They can be carbides, silicide, borides or antimonides with high electrical resistivity such as silicon carbide, tungsten silicide, molybdenum silicide; aluminum diboride, yttrium antimonide or zirconium antimonide. The nanoparticles can be chosen from the combination of the above exemplified nano-particle ingredients. The aforementioned nano-particle ingredients serve only for exemplary instances not as a limitation of materials. Other inert nanoparticles without departing from the spirit and the scope of the present invention are intended to include within the appended claims.

Disclosed herewith is the way to modify Sb or Bi film with different amounts of inert nanoparticles to adjust electrical resistivity of the resultant film. The inert nanoparticles are with the size of 3 to 5 nm. The resultant modified Sb film becomes granular film whose electrical resistance after crystallization is adjustable by the adding amount. The way to deposit can be the co-sputtering. The targets can be a target of pure Sb metal and a target made of the material of nanoparticles. The former can be deposited by the DC sputtering or Radio-Frequency (RF) sputtering; the latter can be deposited by RF sputtering in case of insulating. By adjusting sputtering power, the content of inert nanoparticles of 3 to 50 mol % can be obtained. The deposition rate is kept at 0.33 nm/min or lower.

The result of adding 7 mol %, 11 mol %, 16 mol %, and 25 mol % of aluminum oxide (Al$_2$O$_3$) into 5 nm Sb film is demonstrated. The electrical resistance at amorphous phase of the modified Sb film with 5 nm is raised slightly. However, electrical resistance at crystalline phase can be increased by 12%, 25%, 33%, and 50%, respectively.

The result of adding 5 mol %, 9 mol %, 18 mol %, and 27 mol % aluminum nitride (AlN) into 5 nm Sb film is then demonstrated. Electrical resistivity at amorphous phase is slightly raised by such modification. While electrical resistivity at crystalline phase is increased by 8%, 12%, 30%, and 41%, respectively.

The effect of adding nanoparticles on increasing electrical resistance is much obvious in 5 nm Sb film (more than 100%) than in 100 nm Sb film. The reason is that as the size of the nanoparticles being between 2 and 5 nm will be more electronic scattering in a 5 nm film than in 100 nm film.

Hereinafter, following is a summary of aforementioned techniques for the doped single element phase. The doping concentration of elements is between 1 and 18 at %, depending on the aforementioned solid solubility. For keeping the volume change during phase change to be less than 3%, the doping concentration can be further adjusted, usually less than 12 at %. Moreover, if it desirable to keep high doping concentration and in the meantime low volume change, the granular thin film can be adopted.

However, the film made of pure Sb element without being doped does comprise trace amount of oxygen introduced during processing wherein the content of oxygen is usually between 0.1 and 0.5 at %. In the manufacture of the film, even in a vacuum with background pressure of $1 \times 10^{-6}$ Torr, trace amount of impurities, for instance, oxygen, carbon, or nitrogen can inevitably be incorporated. If the deposited film is with a relatively high activity, the oxygen content is relatively large. The oxygen content of the undoped Sb film in the present invention is better to be controlled less than 0.5 at % depending on residual water in the vacuum system and the leak rate. The best is to control the oxygen content at less than 0.3 at %. In order not to interfere with the phase-change memory function, the total content of the all inevitable impurities should be controlled to less than 1 at %.

Materials of a Dielectric Layer 400

The material of the dielectric layer 400 can be oxides and nitrides which are electrically insulating. The dielectric materials of choice should have no physical and chemical reactions with the memory-layer 100 up to a high temperature at least 1200° C. General dielectric material in integrated circuit processing can be used in the present invention. For instance, the material can be silicon dioxide, silicon nitride, silicon oxynitride, aluminum oxide, aluminum nitride, hafnium oxide, titanium oxide or magnesium oxide.

Materials of the Electrodes

The material of the first electrode 300 or the second electrode 500 should of low electrical resistivity. Its electrical resistivity should be less than 50 mΩ-cm at room temperature, generally between 0.02 mΩ-cm and 5 mΩ-cm. Moreover, it is with high thermal stability, keeps as a stable solid state with low electrical resistivity at a high temperature of at least 1200° C. The material can be, but not limit to, ruthenium, tungsten, tantalum, ruthenium oxide, ruthenium dioxide, titanium nitride, or tantalum nitride.

Materials of the Barrier Layers

The barrier layer is divided into the electrical conductive barrier layer 200 and insulating barrier layer 500. The following describes principle of choices for the material of the two barrier-layer types.

The electrical conductive material for the electrical conductive barrier layer 200 should be wettable with the memory-layer 100 and should not have any physical reaction (for instance, diffusion) and chemical reactions (for instance, combination) with the memory-layer 100. Its electrical resistivity should be less than 1000 mΩ-cm at room temperature, generally between 0.1 mΩ-cm and 100 mΩ-cm. The electrical conductive barrier layer 200 keeps a stable solid state at a high temperature of at least 1000° C., even to 1200° C. preferably. The electrical conductive barrier layer 200 should be strong enough to retard any possible intermixing among the memory-layers 100 of the multiple sandwich-memory-units. Besides, the barrier should be able to retard possible interactions between the memory-layer 100 and the electrodes. The electrical conductive barrier layer 200 works to adjust adhesion between the memory-layer 100 and the first electrode 300, and between the memory-layer 100 and the second electrode 500. Moreover, since there is no diffusion between the electrical conductive barrier layer 200 and the memory-layer 100, the solid solubility of the electrical conductive barrier layer 200 in Sb or Bi is null or so little to be negligible at a high temperature of at least 1000° C.

To fulfill aforementioned criteria, the material of the electrical conductive barrier layer 200 can be refractory metals, conductive inorganic compounds with high-temperature stability, or antimonides with high-temperature stability, to be further described as following.

The refractory metals of choice, for instance, pure tungsten, pure tantalum, and pure rhenium are able to be applied as the electrical conductive barrier 200 in the memory-layer 100 made of Sb or Bi because of no chemical reactions nor dissolution in Sb and Bi; among them, the pure tungsten is the best. On the other hand, pure molybdenum, pure ruthenium, and pure iridium which form compounds with Sb at low temperature, are not applicable as the electrical conductive barrier layer 200 to the memory-layer 100 made of the single Sb phase. While in the case of memory-layer 100 being made of Bi, pure molybdenum, pure ruthenium, pure iridium are applicable since no chemical reactions nor dissolution into Bi occur.

Conductive inorganic compounds with the high-temperature stability can also be used as the electrical conductive barrier layer 200. Taking as example not as limitation are, oxides comprising ruthenium dioxide, lanthanum-nickel oxide; nitrides comprising titanium nitride, tantalum nitride; borides: lanthanum hexaboride, titanium boride; carbides comprising titanium carbide, tantalum carbide, silicon carbide; and silicide comprising molybdenum disilicide, etc.

Antimonides with the high-temperature stability, for instance, yttrium antimonide (YSb) whose melting point reaches 2310° C. and its electrical resistivity is as low as 35 μΩ-cm. Other choices include zirconium antimonide, specifically $ZrSb_2$ whose melting point reaches 1250° C.; or titanium antimonide, specifically $TiSb_2$ whose melting point reaches 1050° C.

Material of the electrical insulating barrier layer 701 can be the same as the dielectric layer 400. It is not allowed to interact with the memory-layer 100. The materials of choice can be, but not limited to antimony oxide, silicon oxide, aluminum oxide, magnesium oxide, zirconium oxide, hafnium oxide, titanium oxide, aluminum nitride, silicon nitride, or silicon oxynitride.

The following description discloses the utilization of the barrier layer. Deposition of multiple-layered structure comprising the substrate 600/the 10 nm barrier layer/the 5 nm Sb film/the 10 nm barrier layer is carried out. After the multiple-layered structure is heated at 500° C. and 600° C. under high vacuum for 10 minutes, roughness of the barrier layer is measured by Atomic Force Microscopy and a mean value of the roughness is taken. Before it is heated, the roughness is 0.28±0.02 nm. The range of scan is 1 square micrometer. Meanwhile, another multiple-layered structure comprising of $Si/SiO_2$/20 nm-TiN/5 nm-$Ge_2Sb_2Te_5$/20 nm-TiN is measured as a control group. After the control group is heated at 500° C. and 600° C. for 10 minutes, respectively, the roughness of the control group is between 0.32 and 0.38 nm. Results are summarized in Table 4.

Table 4 demonstrates the surface roughness of the multiple-layered structure comprising the substrate 600/10 nm barrier-layer/5 nm Sb-film/10 nm barrier layer after being heated at 500° C. and 600° C. under high vacuum for 10 minutes. The surface roughness is measured by the Atomic Force Microscopy and the mean value of the roughness of the barrier layer is calculated. The range for scan is 1 square micrometer.

TABLE 4

| materials of the barrier layer | melting point ° C. | conductive/ insulating | heating conditions | |
|---|---|---|---|---|
| | | | 500° C., 10 min | 600° C., 10 min |
| W | 3422 | conductive* | 0.38 nm | 0.40 nm |
| YSb | 2310 | conductive* | 0.36 nm | 0.47 nm |
| $TiSb_2$ | 1050 | conductive | 0.48 nm | 0.55 nm |
| $ZrSb_2$ | >1200 | conductive | 0.43 nm | 0.45 nm |
| $HfSb_2$ | >1400 | conductive | 0.40 nm | 0.42 nm |
| $NiSb_2$ | 621 | conductive | incomplete barrier layer | incomplete barrier layer |
| $CoSb_2$ | 874 | conductive | incomplete barrier layer | incomplete barrier layer |
| $FeSb_2$ | 738 | conductive | incomplete barrier layer | incomplete barrier layer |
| $CrSb_2$ | 718 | conductive | barrier layer incomplete | barrier layer incomplete |
| SiC | ~2545 | Semi-conductive* | 0.31 nm | 0.38 nm |
| $TiN_x$ | ~3220 | conductive* | 0.40 nm | 0.42 nm |
| $TaN_x$ | >2000 | conductive* | 0.43 nm | 0.45 nm |
| AlN | 2800 | insulating | 0.36 nm | 0.37 nm |
| SbO | >1500 | insulating | 0.38 m | 0.40 nm |

Mark* represents electrical resistivity at room temperature (mΩ-cm);
W: 0.010;
YSb: 0.035;
$TiN_x$: 0.45;
$TaN_x$: 2.5; and
SiC: 950.

The results in the Table 4 demonstrates that tungsten (W), yttrium antimonide (YSb), titanium diantimonide ($TiSb_2$), zirconium diantimonide ($ZrSb_2$), hafnium diantimonide ($HfSb_2$), silicon carbide (SiC), titanium nitride ($TiN_x$), tantalum nitride ($TaN_x$), aluminum nitride (AlN), and antimony oxide (SbO) are very good choice for the barrier layer. Other materials provided by other experiments, for instance, titanium carbide (TiC), dititanium carbide ($Ti_2C$), ditantalum nitride ($Ta_2N$), tantalum carbide (TaC), silicon nitride ($Si_3N_4$), and ditantalum carbide ($Ta_2C$) are also suitable as the material of the barrier layer. Other materials for use as the barrier layer without departing from the spirit and the scope of the present invention is intended to include within the appended claims.

Table 4 further demonstrates that nickel diantimonide ($NiSb_2$), cobalt diantimonide ($CoSb_2$), iron diantimonide ($FeSb_2$), and chromium diantimonide ($CrSb_2$) are not suitable for use as the material of the barrier layer because of its low melting point giving rise to less thermal stability.

It is noticeable that the material of the upper and lower barrier layers can be the same material or different materials depending on different needs for integrated circuit device-designs.

The following embodiment discloses the effect of different barrier layers at various thickness on properties of the sandwiched Sb-layer, 5 nm in thickness. Table 5 shows properties of the 5 nm pure Sb film as the memory-layer 100 which is sandwiched between the barrier layers of $SiO_2$, $SbO_x$, SiC, or $Si_3N_4$, with 2 nm to 100 nm thickness. From Table 5, it is learned that the different layers result in quite a large difference on aspects of crystallization temperature (Tc), the ratio of electrical resistance between amorphous phase and that of crystalline phase (Ra/Rc), and the temperature for 10-year data failure ($T_{10Y}$). One who is skilled in the art can make a choice according to the trend demonstrated in Table 5 and the proper barrier materials listed the Table 4. Moreover, Table 5 also discloses that the differences arising from the thickness of the barrier layer are minimal.

Table 5 demonstrates the differences in crystallization temperature (Tc), the ratio between electrical resistance of amorphous phase to that of crystalline phase (Ra/Rc), and the temperature for 10-year data failure ($T_{10Y}$) of the 5 nm pure Sb film sandwiched between barrier layers with 2 nm to 100 nm thickness made of $SiO_2$, $SbO_x$, SiC, or $Si_3N_4$.

TABLE 5

| barrier layer, thickness | Tc (° C.) | Ra/Rc | $T_{10Y}$ (° C.) |
|---|---|---|---|
| $SbO_x$, 2 nm | 220 | 24000 | 120 |
| $SiO_2$, 100 nm | 210 | 17700 | 103 |
| SiC, 100 nm | 210 | 9000 | 128 |
| $Si_3N_4$, 5 nm | 190 | 10000 | 149 |

The following is a preferable embodiment of the memory devices as applied to set forth applications by means of carrying out set and reset operations to verify cyclability, and to disclose the outcome of the present invention.

Embodiment 1

The undoped Sb-film as the phase-change material is made into a bridge-memory-device which means that the operation current is applied to flow parallel to the plane of the Sb-film. The processing of this device is as follow: at the deposition rate of 0.33 nm/min, a Sb-film is deposited on $SiO_2$/Si with the thickness of 5 nm. It is inevitably contaminated with trace impurity of oxygen. The Sb-film is deposited between the first electrode 300 which is the left electrode in FIG. 10, and the second electrode which is the right electrode in the FIG. 10. A layer of silicon oxide with the thickness of 100 nm is deposited on top of the Sb-film which is then sandwiched between two barrier $SiO_2$ layers. Focused ion beam (FIB) is used to cut the sandwiched Sb-film into bridge memory device with a length of 1000 nm and a width of 200 nm. The sectional view is observed by the transmission electron microscopy (TEM) shown as the inset in FIG. 10.

Figure 10:
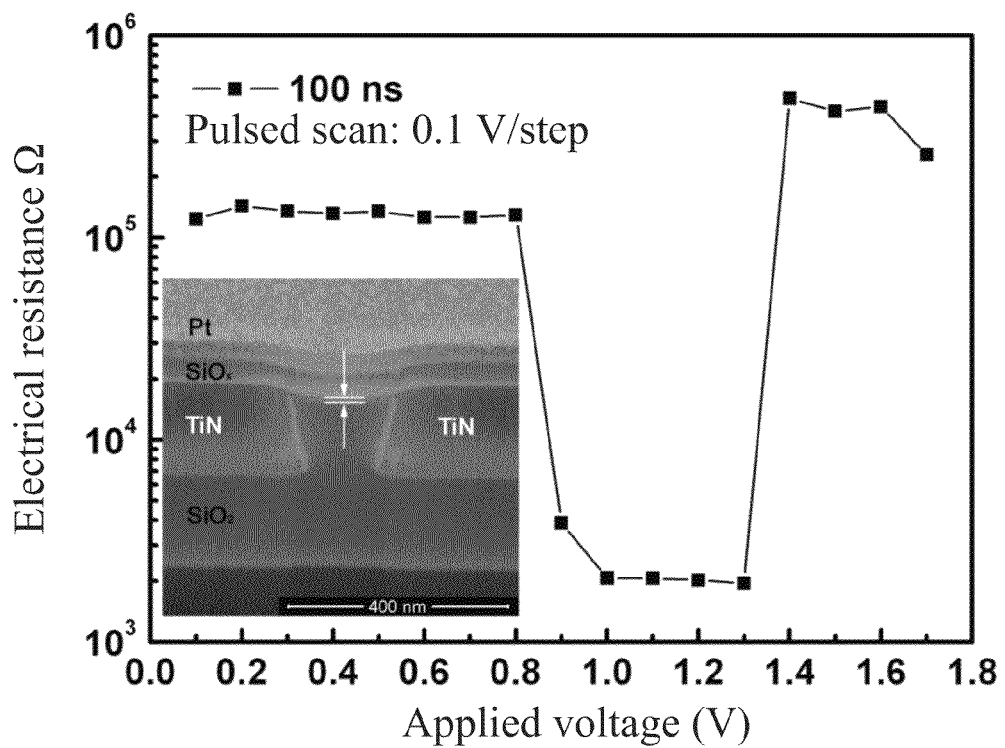
FIG. 10 illustrates the relationship between the applied voltage (V) and electrical resistance (Ω) of the undoped Sb-film made into a bridge-memory-device as amplitude of the applied voltage (volt) is varied during the test. Pulse-width of the applied voltage is 100 ns. The inset in FIG. 10 is the sectional view of the bridge-memory-device observed by the transmission electron microscopy (TEM).

FIG. 10 also illustrates relationship between the applied voltage (V) and electrical resistance (Ω). Pulse-width of the applied voltage is 100 ns, amplitude of the applied voltage (volt) is varied during device testing. FIG. 10 shows that set begins when the voltage is greater than 0.8 V, the corresponding electrical resistance drops instantly. When the voltage reaches 1.0 V, set is complete and electrical resistance reaches the lowest value. Reset begins when the voltage is 1.3 V and it is complete when the voltage is 1.4 V; the resistance returns back to that of amorphous phase. Therefore, the bridge memory cell can be set and reset stably and electrical resistance difference between the two states reaches more than 50-fold. Electrical resistance of complete reset is slightly higher than initial resistance. The bridge memory cell is slightly heated by the ion beam during FIB processing which induces trace amount of nano-crystallite in the Sb-film of the as-prepared device. Electrical resistance of the as-prepared device is thus slightly lowered.

This preferable embodiment adequately demonstrates that bridge memory cell made of the sandwiched Sb film can be stably set and reset at voltage pulses less than 1.5 V at the operating speed of 100 ns. Electrical resistance difference between set and reset states is larger than 50-fold. The device shows excellent memory operation capability.

Embodiment 2

Figure 11:
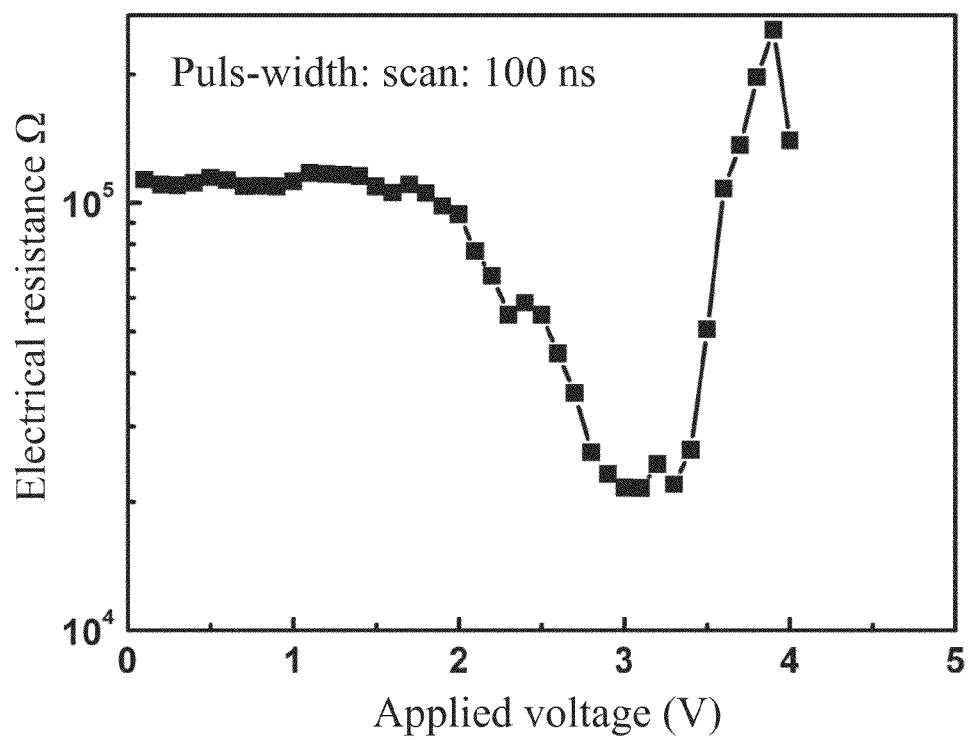
FIG. 11 illustrates electrical resistance (Ω)-voltage (V) during set and reset operations of the vertical memory-cell made of undoped Sb-film with 400 square nanometers.

In this preferable embodiment, a three-layered sandwich structure made of undoped Sb film is made into a vertical memory device, which means that operation current flows vertical to the plane of the Sb-film. First, bottom electrode TiN, which acts also as the conductive barrier layer, is deposited onto $SiO_2$/Si substrate. After deposition of a dielectric layer $SiO_2$, two vias with sizes of 400 nm, and 800 square nanometers, respectively, are prepared by photolithography by the back-end-of-line of a complementary-metal-oxide-semiconductor (CMOS) processing. Undoped Sb-film is deposited into the vias at the deposition rate of 0.33 nm/min until the thickness of 5 nm. Thereafter, the TaN top electrode, which also acts as another conductive barrier layer, is deposited. FIG. 11 illustrates electrical resistance (Ω)-voltage (V) during set and reset operations of the vertical memory-cell made of undoped Sb-film with 400 square nanometers. The pulse width is 100 ns. The set voltage is 2.5 V to 3V and the reset voltage is 4 V. The ratio between the high and low electrical resistances is more than 5 times.

Figure 12:
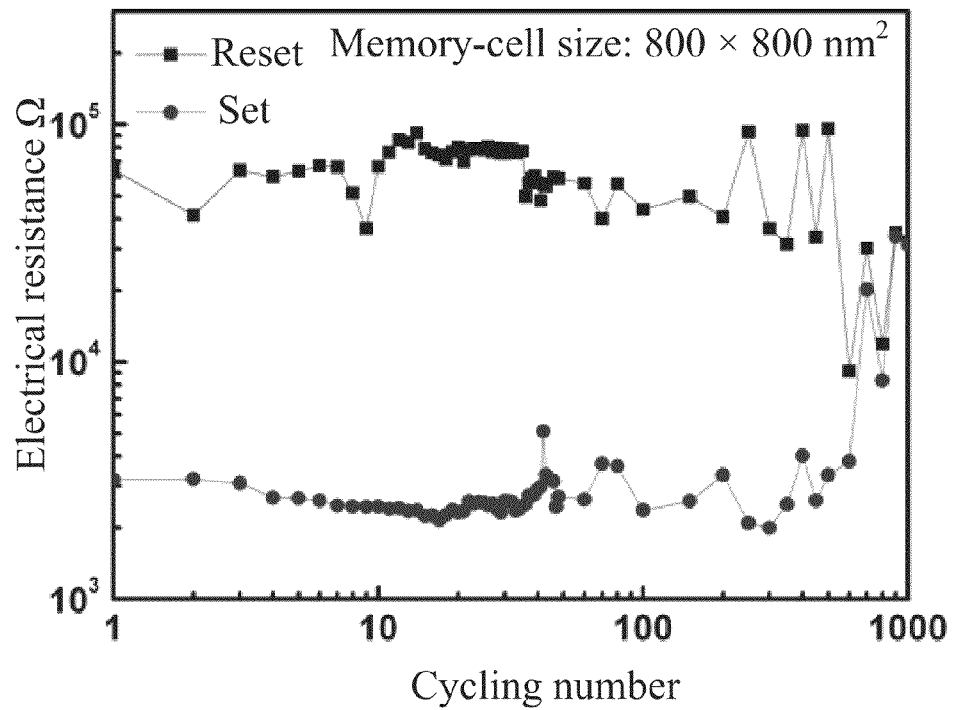
FIG. 12 illustrates set-reset results of a vertical memory-cell made of undoped Sb film with 800 square nanometers.

FIG. 12 illustrates set-reset results of a vertical memory-cell made of undoped Sb film with 800 square nanometers. The set voltage is 4.5 V and the set pulse-width is 1 minisecond; the reset voltage is 6.0 V and the reset pulse width is 10 microsecond. The cycling number reaches 500 cycles. The ratio between the high and low electrical resistances is more than 10-fold.

Embodiment 3

In this preferable embodiment, 8 at % carbon doped single Sb-phase film ($C_{8\ at\ \%}$), at 10 nm thickness, is made into a vertical memory-cell and tested by the processes described in Embodiment 2. With Sb(C) as the memory material, the memory-layer 100 is can be connected with the electrodes on upper and lower sides. Cell structure is a three-layered sandwich-structure the same as that shown in the FIG. 1 (A). The material of the electrodes and the barrier layer is nitrides, TiN on the bottom and TaN on top. Silicon oxide formed by a low temperature process is adopted as the material of the dielectric layer 400. The deposition rate of the memory-layer 100 is 0.33 nm/min.

Figure 13:
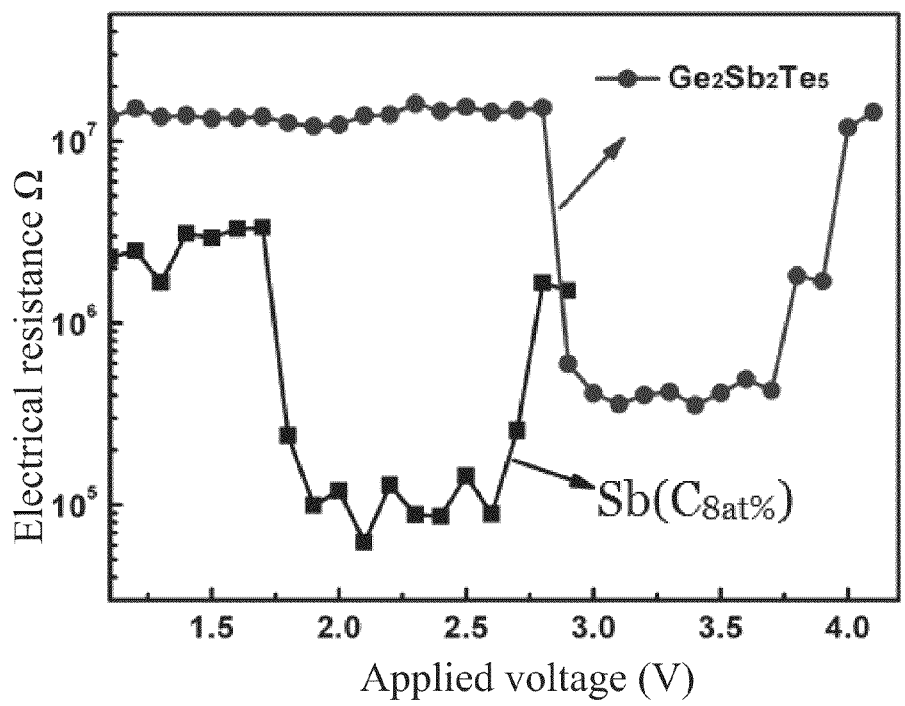
FIG. 13 illustrates the set-reset result of the Sb ($C_{8at\%}$) and $Ge_2Sb_2Te_5$ memory cells with the switched electrical resistance.

FIG. 13 illustrates the electrical resistance (Ω)—applied voltage (V) curve (R-V curve) of the memory cell upon set-reset is carried out using a pulse-width of 80 ns. With I-sweep mode, electrical resistance of the vertical memory cell at originally high resistance state can be switched to the low resistance state (set) starting at the voltage of 1.6 V; and reaching the complete set at 2.1 V. The reset starts at 2.6 V and finishes at 2.7 V. In the FIG. 13, the control memory-cell made of conventional $Ge_2Sb_2Te_5$ material is also shown. With the same preparation method, both Sb ($C_{8at\ \%}$) and $Ge_2Sb_2Te_5$ memory cells demonstrate the typical U-shaped R-V curve. The conventional $Ge_2Sb_2Te_5$ needs 5 microsecond for proper operations showing set voltage starting at 2.7 V and finishing at 3 V; while reset starting at 3.7 V and finishing at 4 V. The memory cell made of Sb($C_{8at\ \%}$) film shows a much promising performance that that of $Ge_2Sb_2Te_5$ cell.

Disclosed in this preferable embodiment are other two vertical memory-cells made of 3 at % carbon doped single Sb-phase ($C_{3at\ \%}$) at 7 nm thickness and 5 at % carbon doped single Sb-phase ($C_{5at\ \%}$) at 15 nm are prepared in similar processes. The R-V curves of the two vertical memory-cells are measured using pulsed voltage of 100 ns. With I-sweep mode, electrical resistance of the vertical memory-cells originally at high resistance state can be switched to the low resistance state set-state at the voltage of 1.0 to 1.5 V. The complete reset voltage of both memory-cells is 2.0 to 2.2 V. The ratio between the high and low electrical resistances is more than 20-fold. The cyclability of the test memory-cell reaches more than ten-thousand times.

This preferable embodiment fully demonstrates that memory-layer 100 made of carbon doped Sb with different thickness does show phase-change at low voltages, with high operating speed, and good cyclability.

Embodiment 4

Figure 14:
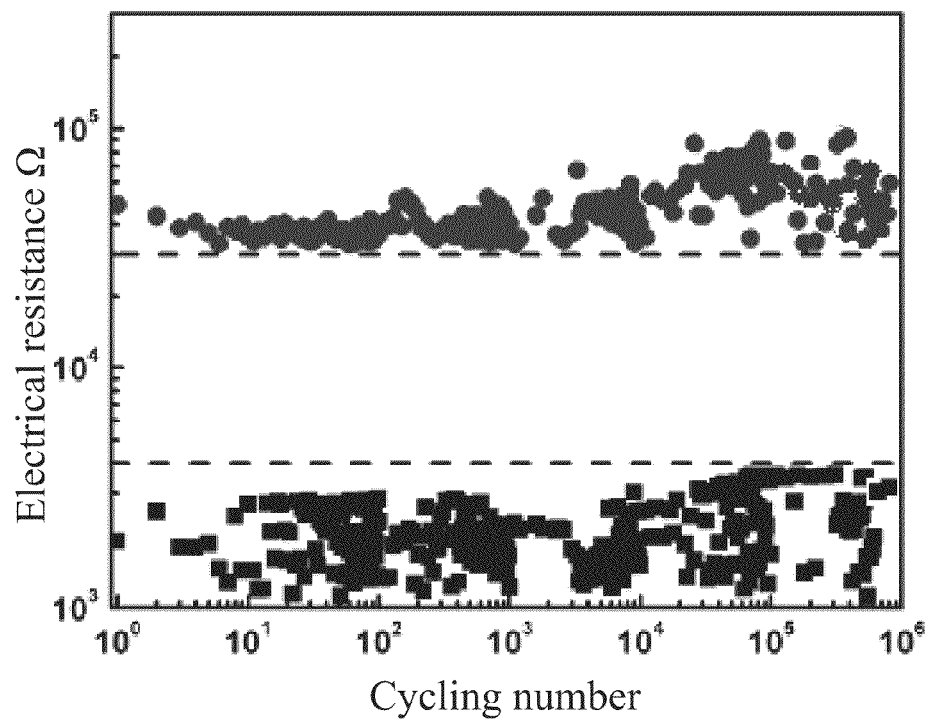
FIG. 14 illustrates set-reset results of the three-layer sandwich structured vertical memory cell made of Sb ($Ga_{16at\%}$) with thickness of 10 nm.

The preferable embodiment demonstrates the performance of the vertical memory-cells with the memory-layer 100 made of gallium doped single Sb-phase film. FIG. 14 illustrates the three-layer sandwich structured vertical memory cell with 200 square nanometers is repeatedly set and reset, wherein the 16 at % Ga doped single Sb-phase, Sb ($Ga_{16at\%}$), is 10 nm thick and the deposition rate is 0.33 nm/min. The operational conditions are 2.6 V for set at 5000 ns pulse-width; 4 V for reset at 100 ns pulse-width. The ratio between the high and low resistance is more than 6-fold. It can be learned from the FIG. 14 that the cycling number is nearly 1 million times.

Demonstrated in this preferable embodiment are other sandwiched vertical memory cells with 200 square nanometers, wherein the memory-layer 100 is made of single Sb($Ga_{12at\%}$) at 15 nm thickness, Sb($Ga_{10at\%}$) at 10 nm thickness, and Sb($Ga_{15at\%}$) at 7 nm thickness, prepared at the deposition rate of 0.33 nm/min. The complete set voltage is 2.1 to 2.5 V at 1000 ns pulse-width, and the complete reset voltage is 3.4 to 3.8 V at 100 ns pulse-width. The ratio between the high and low resistance is more than 10-fold.

This preferable embodiment fully demonstrates the sandwiched memory-layer 100 made of gallium doped single phase Sb at various thickness do show promising phase-change memory behavior with high operating speeds and large window of electrical resistance.

Embodiment 5

This preferable embodiment demonstrates sandwiched memory cells made of the single phase Sb-film doped with another element in a vertical memory-cell mode, which means that the operation current flows vertical to the plane of the memory-layer 100. With Sb(M) as the single phase memory material wherein M is one of Ge, Si, B, N, O, Ti, Ta, W, or Te within each of their limit range of solid solubility.

In the preferable embodiment, the thickness of memory-layer 100 made of Sb(M) is 10 nm and the deposition rate is 0.33 nm/min. The three-layer-structure vertical memory cell is 200 square nanometers. The complete set voltages at 1000 ns, though being scattered due to different doping elements and concentrations, is between 1.5 and 2.8V; the complete reset voltage is between 3.0 and 4.2V at 100 ns. The ratio between the high and low electrical resistances is between 5 and 12.

Embodiment 6

The preferable embodiment aims to illustrate the design method and the multiple sandwich-memory-units connected in series.

In series design, each of the barrier layer of the multiple sandwich-memory-units should be electrically conductive. The multiple sandwich-memory-units, first electrode 300 and the second electrode 500 are electrically connected in series. The material of each memory-layer 100 of the multiple sandwich-memory-units can be the same, such as undoped Sb film, but at different thickness. On the other hand, the thickness of each memory-layer 100 of the multiple sandwich-memory-unit can be the same, for example 10 nm, but the materials are different, such as single phase Sb-films doped with different elements or concentrations. In other designs, both the material and thickness of each memory-layer 100 can be different. In any case, the variation in thickness of each memory-layer 100 is to be controlled within plus and minus 0.5 nm to ensure a controllable crystallization faction, hence electrical resistance, during set operation of each memory-layer 100. The deposition rate of the memory-layer 100 is to keep at 0.33 nm/min or slower. The difference in crystallization temperature among each layer is controlled to be more than 20° C. by means of precise adjustment of materials and thickness. It can be tuned to set just one specific memory-layer 100 in the multiple sandwich-memory-units using a voltage-pulse of proper amplitude.

A 200-nm-diameter memory-cell comprises one undoped Sb-film with thickness of 5 nm and another undoped Sb-film with thickness of 6 nm and is sandwiched in between upper, middle and lower barrier layers. Each barrier layer is made of tungsten with the thickness of 8 nm. The first electrode 300 and the second electrode 500 of the multiple sandwich-memory-units are made of TaN.

When the two undoped Sb-films are both at amorphous phase, the total electrical resistance is 4.2 MΩ. By applying to the memory cell a voltage of 0.84 V at pulse-width 100 ns, referring to FIG. 10, the layer of the 6-nm undoped Sb-film is completely crystallized. While the layer of the 5 nm undoped Sb film is partially crystallized. Moreover, the total electrical resistance of the memory-cell became the value of 72 kΩ which in fact can be further precisely tuned by adjusting the applied voltage which will vary the fraction of partially crystallized volume. When the applied pulsed voltage is higher at 1.1V, referring to FIG. 10, both the 6 nm and 5 nm undoped Sb-films are completely crystallized. The total electrical resistance of the memory-cell becomes 3.1 kΩ. The sandwich-memory-units comprising two memory-layers 100 can be thus set to be 4.2 MΩ, 72 kΩ, 3.1 kΩ, respectively. The ratio of electrical resistance among the three is 1350:23:1.

By applying an even higher voltage of 1.3 V, referring to FIG. 10, to the memory-cell, both the two undoped Sb films in the sandwich-memory-units can be completely reset to amorphous phase. The total electrical resistance is more than 4 MΩ.

The multiple sandwich-memory-units connected in series can also be operated by first full set to the lowest electrical resistance state, then are gradually reset to higher and higher electrical resistance. For instance, by applying a pulsed voltage of 1.2 V at pulse-width 100 ns, referring to FIG. 10, the layer of the 6 nm pure Sb film can be completely reset and the layer of the nm pure Sb film is partially reset. The total electrical resistance becomes 150 kΩ. By applying a higher voltage 1.4 V, referring to FIG. 10, both the layers of 6 nm and 5 nm undoped Sb films are completely reset. The total electrical resistance is higher than 4 MΩ. The levels of electrical resistance of the three-layer memory become 3.1 kΩ, 150 kΩ, 4.2 MΩ, and the resistance ratio is 1:48:1350.

Embodiment 7

This preferable embodiment aims to illustrate the design method and the multiple sandwich-memory-units connected in parallel.

In the parallel design, each the barrier layer of the multiple sandwich-memory-units should be electrical insulating. The multiple sandwich-memory-units, first electrode 300 and the second electrode 500 are connected in parallel. The material of each of the memory-layer 100 in the multiple sandwich-memory-units can be the same or different. Each memory-layer 100 in the preferable embodiment can be undoped Sb film but with different thickness. The differences in crystallization temperature among each layer should be more than 20° C. by means of precisely adjusting material and thickness. Each set pulse is controlled to give rise to crystallization of just one memory-layer 100 of the sandwich-memory-units.

A memory cell, 100 nm in diameter, connected in parallel comprises one 4 nm undoped Sb-film and one 6 nm pure-Sb film sandwiched in between upper, middle and lower barrier layers which are made of SbO at 8 nm. The left electrode and right electrode are made of TaN which is also the material of extra side barriers. The deposition rate during preparation of the two Sb-films is controlled to be not higher than 0.33 nm/min. The total electrical resistance of the memory-cell when the two layers of 4 nm and 6 nm pure Sb films are in amorphous phase is 2.7 MΩ. If the 6 nm Sb film is doped with 16% $Al_2O_3$, electrical resistance at crystalline phase will be 30 kΩ.

By applying to the memory-cell a low voltage of 0.81 V at pulse-width 100 ns, referring to FIG. 10, the layer of the 6 nm pure Sb film is completely set to full-crystallization, and the layer of the 4 nm pure Sb film is completely amorphous. The total electrical resistance is 30 kΩ.

By applying to the memory-cell a higher voltage of 1.2 V at pulse-width 100 ns, referring to FIG. 10, both the layers of 6 nm and 4 nm Sb films are completely set, or crystallized. The total electrical resistance is 2.7 kΩ. At a shorter pulse-width and higher voltage of 1.7 V, referring to FIG. 10, applying to the memory-cell, both 4 nm and 6 nm Sb-films in the memory-cell can be completely reset to full amorphous phase. The total resistance is back to 2.7 MΩ. The memory-cell can thus be operated to show electrical resistance of 2.7 MΩ, 30 kΩ, 2.7 kΩ, respectively whose ratio is 1000:11:1.

Embodiment 8

This preferable embodiment aims to illustrate the design method of multiple sandwich-memory-units connected in parallel or in series. The material of each memory-layer 100 of the multiple sandwich-memory-units can be the same or different. The preferable embodiment illustrates different designs using the memory-layers 100 of the same thickness, 10 nm, and same doping element, Ga, but at different doping concentration. In the preferable embodiment, three sandwich-memory-units are adopted. The deposition rate of the memory-layers 100 is not higher than 0.33 nm/min. The memory-layer 100 of the first sandwich-memory-unit is $Sb(Ga_{5at\%})$, the memory-layer 100 of the second sandwich-memory-unit is $Sb(Ga_{12at\%})$, and the memory-layer 100 of the third sandwich-memory-unit is $Sb(Ga_{16at\%})$. Material of each barrier layer is in compliance with above disclosures at the thickness of 15 nm. The crystallization temperature of each memory-layer 100 is 165° C., 195° C., 236° C., respectively. The differences among them are 30° C. and 41° C. These differences allow crystallization to occur, set, layer by layer. The three sandwich-memory-units are reset back to full amorphous in the same time using a high voltage.

Embodiment 9

The preferable embodiment aims to illustrate the design of multiple sandwich-memory-units connected in parallel or in series. The thickness of each memory-layer 100 of the multiple sandwich-memory-units and doping elements can be varied according to the need of memory devices.

Three sandwich-memory-units are adopted as the example, wherein the deposition of the memory-layer 100 is not higher than 0.33 nm/min and the thickness of the memory-layer 100 can be either 5 nm or 10 nm. The memory-layer 100 of the first sandwich-memory-unit is the undoped Sb film at the thickness of 5 nm. The memory-layer 100 of the second sandwich-memory-unit is the Sb-film doped with C, $Sb(C_{5at\%})$, at thickness of 10 nm. The memory-layer 100 of the third sandwich-memory-unit is the Sb-film doped with C, $Sb(C_{5at\%})$, but the thickness is 5 nm. The material of each barrier-layer is in compliance with above disclosures and the thickness of each barrier-layer is 15 nm. The crystallization temperature of each memory-layer 100 is 210° C., 243° C., 280° C. respectively. The differences of the three memory-layer 100 are more than 33° C., which is large enough for tuning crystallization, set, in a layer-by-layer manner. The three sandwich-memory-units are reset altogether.

Embodiment 10

This preferable embodiment aims to illustrate electrical resistance drifting after a memory-cell comprising single sandwich-memory-unit being reset. If the resistance drifting after being reset of the memory-cell is too large, it is disadvantageous for multi-level memory. The preferable embodiment additionally aims at demonstrating the excellent performance on aspect of low electrical resistance drifting of the multi-layered phase-change memory device of this invention.

A memory cell 400 square nanometers in size is prepared comprising a 5 nm undoped Sb film as the memory-layer 100 in the single sandwich-memory-unit. The memory cell is set and reset cycled for 5 times under pulse-width 100 ns. It is in the reset amorphous phase and kept at constant temperatures of 25° C., 45° C., 65° C., and 85° C., respectively, during resistance measurements. FIG. 15 (A) shows measurement results of electrical resistance drifting. Using a voltage of 0.1 V, electrical resistance (Ω) versus measuring time (t) of the memory-cell is obtained as in FIG. 15 (A). Electrical resistance drifting of the memory-cell can be interpreted by following equation:

$$R(t)=R_0(t/t_0)^v \qquad (2)$$

Where R(t) represents the resistance at the time t. $R_0$ and $t_0$ represent electrical resistance and the time at the initial of measurement, respectively; v represents an exponential constant. In FIG. 15 (A), the exponential constant v at one constant temperature can be obtained by calculating the slope of each line. When it is at 25° C., 45° C., 65° C. and 85° C., respectively, the v values are 0.0187, 0.0161, 0.0132, and 0.0113, respectively.

Figure 15A:
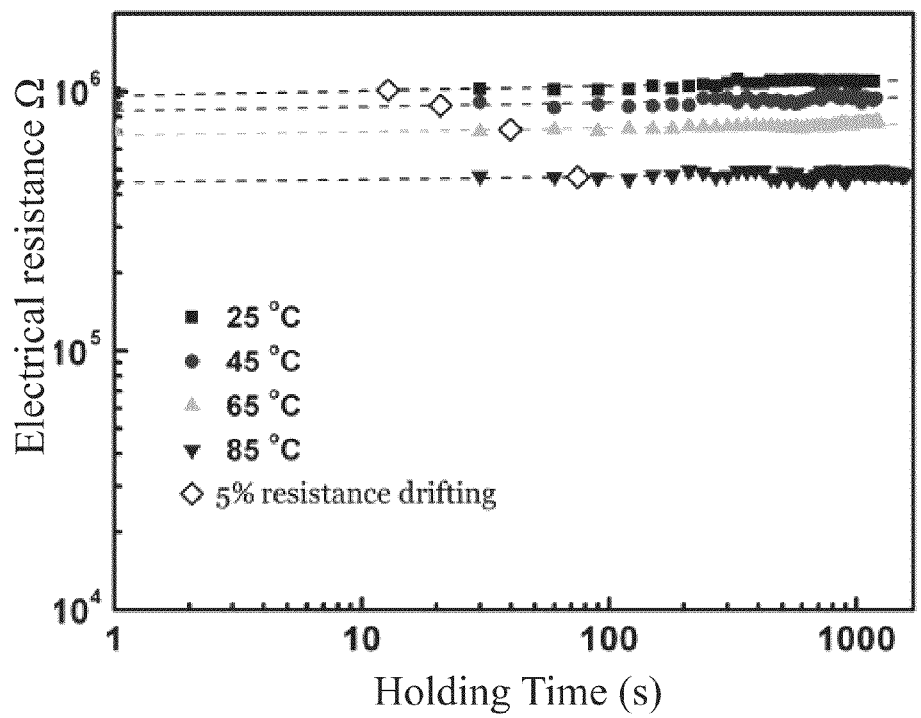
FIG. 15(A) illustrates electrical resistance (Ω) versus measuring time (t) of the memory-cell at constant temperatures of 25° C., 45° C., 65° C., and 85° C.
Figure 15B:
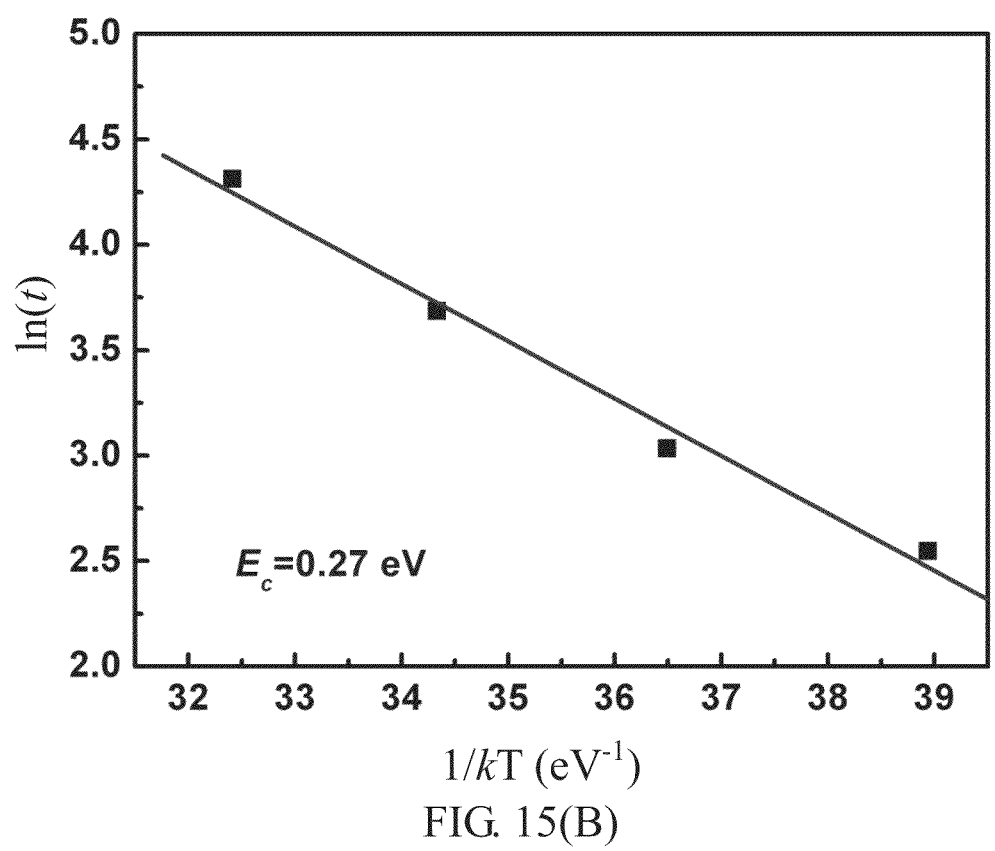
FIG. 15(B) illustrates by using Arrhenius plot, taking logarithm of the time of 5% resistance drifting versus 1/kT, the slope of the line representing the active energy (Ec).

The time corresponding to 5% resistance drift is identified in FIG. 15(A), denoted by small rhombus symbols. By using Arrhenius plot, taking logarithm of the time of 5% resistance drifting versus 1/kT, a new graph is drawn as showed in FIG. 15(B), the equation as following:

$$\ln(t)=E_c/kT-\ln(\tau) \qquad (3)$$

Where $E_c$ represents active energy (eV), τ represents a time constant, and the slope of the line representing the active energy (eV) of the resistance drifting is 0.27 eV, as shown in FIG. 15(B).

Aforementioned values of exponential constant v and active energy (eV) slightly decline when the thickness of the undoped Sb film increases from 5 nm to 10 nm and 15 nm. However, they slightly increase with raising doping concentration of the doped Sb-films. Comparing with electrical resistance drifting data of the memory-cell made of $Ge_2Sb_2Te_5$, in prior art has the v value of 0.11, $E_c$ value of 0.6 eV. The present invention disclose a v value which is five to ten fold less and the active energy is less than half of those of $Ge_2Sb_2Te_5$. This is a substantial improvement. The reason of such improvement is due to the extremely small volume change, less than 0.5% during phase change as shown in FIG. 7, of the undoped Sb film in the single sandwich-memory-unit. Therefore, residual stress generated by the memory cell during phase change is rather low. Moreover, with only one element, there is no composition variation effect. The sandwiching barrier layers also prohibit possible interactions of the Sb-memory-layer and electrode materials. The overall effects give rise to extremely low resistance change versus time. This is an extra substantial advantage of the present invention.

This preferable embodiment illustrates the solution of one of technical problems encountered in conventional phase-change memory. It is to reduce electrical resistance drifting after the memory-cells being reset.

It is learned from aforementioned preferable embodiments that with different thickness and material of the memory-layer 100 in compliance with the electrical conductive barrier layer 200 or the electrical insulating barrier layer 701 are deposited to form the single or multiple sandwich-memory-unit(s) as the barrier-layer/memory-layer 100/barrier-layer. In the single or multiple sandwich-memory-unit(s), the material of each memory-layer 100 can be all the same or different to adjust electrical resistance as well as crystallization temperature of each memory-layer 100. Above disclosures also disclose that material of the memory-layer 100 can be undoped antimony (Sb) element, doped Sb solid solution; undoped bismuth (Bi) element or doped Bi solid solution. The doped elements as disclosed above can be the same or different.

The designer can choose a proper material and control the thickness of the memory-layer 100 by principles specified in the aforementioned disclosures, to adjust the crystallization temperature, the electrical resistances of the crystalline phase and the amorphous phase of the memory-layer 100. One of better design is to make the crystallization temperature of each memory-layer 100 raised layer by layer. The difference in crystallization temperature of each memory-layer 100 can be easily raised to be more than 20° C. It is better to be more than 40° C., which facilitate the fine adjusting of the set voltage and set pulse-width to crystallize the memory-layers 100 layer by layer successively. The electrical resistance of the multiple sandwich-memory-units can be tuned this way into various levels hence a multilevel memory is resulted. In the aforementioned embodiments the resistance levels can be more than a few hundred percent to more than a thousand times different. This makes easy the recognition of each level of the multi-level memory.

The described material, composition and thickness for each memory-layer 100 in the multi-layered phase-change memory-device are provided for illustration purpose and should not be considered as limitation. Other doping elements into single Sb or Bi element suitable for forming a single phase as memory materials of the device without departing from the spirit and the scope of the present invention are intended to include within the appended claims.

The film can be made by anyone skilled in the art with any acquainted film-deposition techniques to prepare the designed memory-layer 100, the first electrode 300, the second electrode 500, the barrier layers, and the dielectric layer 400. The techniques may comprise but not limited to evaporation, for instance, thermal Evaporation or electron beam evaporation; sputtering, for instance, direct current (DC) sputtering, radio-frequency (RF) sputtering, magnetron sputtering, symmetric sputtering, asymmetric sputtering; or other physical vapor deposition methods. When it is sputtered, proper sputtering targets are applied. They include the undoped Sb target, the target purposely doped with small doping concentration of an element, the target added with inert nanoparticles, the target of the barrier-layer material, and the target of proper electrode material. The deposition of the film can be completed by a chemical vapor deposition (CVD), all kinds of enhanced or assisted CVD such as microwave-assisted CVD; or atomic layer deposition (ALD).

The rate of sputter-deposition used in the present invention to deposit the memory-film should be low enough, for instance, 20 nm/hour which is equivalent to 0.33 nm/min. This is to ensure promising quality of the memory-film. Those who are skilled in the art will be aware of this necessity. If the enhanced or assisted CVD is adopted, the film with higher quality can be obtained in a higher speed. Moreover, if ALD is adopted the best quality film can be attained. Continuous film with 2 nm thickness can be obtained. All the film deposition ways is within the scope or spirit of the present invention.

The way to purposely dope an element into the memory-layer can be carried out by using co-sputtering or CVD, wherein the doping element can be doped during film growth. The doping can also be accomplished by ion implantation wherein the deposited film is bombarded by high energy ion beams with a suitable dose in the ion-implantation chamber.

What is claimed is:

1. A multi-layered phase-change memory device having a single or multiple sandwich-memory-unit(s), comprising:
   a substrate;
   a dielectric layer, disposed on the substrate;
   a first electrode-assembly-layer, disposed on the dielectric layer, comprising a first electrode and a first electrical conductive barrier layer, wherein the first electrical conductive barrier layer is physically and electrically connected with the first electrode;
   the single or multiple sandwich-memory-unit(s), physically and electrically connected with the first electrical conductive barrier layer, each comprising:
      a memory-layer, with a thickness ranging from 30 to 50 nm and is formed of a doped single element, wherein the doped single element comprises about 99 at % of a single element; and
      two barrier-layers physically connected to the top and the bottom surfaces of the memory-layer respectively;
      wherein the two barrier-layers are configured for elevating the crystallization temperature of the memory-layer, and wherein the material of the memory-layer is characterized in that the volume change during phase-change is less than 3%; and
   a second electrode-assembly-layer comprising a second electrode and a second electrical conductive barrier layer, wherein the second electrical conductive barrier layer is physically and electrically connected with the second electrode and the single or multiple sandwich-memory-unit(s).

2. The multi-layered phase-change memory device as claimed in claim 1, wherein the single sandwich-memory-unit stores a bit of binary information, and wherein the multiple sandwich-memory-units store a bit of non-binary information.

3. The multi-layered phase-change memory device as claimed in claim 1, wherein the doped single element is an Sb-based solid solution.

4. The multi-layered phase-change memory device as claimed in claim 1, wherein the doped single element is a Bi-based solid solution.

5. The multi-layered phase-change memory device as claimed in claim 3, wherein the doped single element comprises a dopant, and wherein the dopant is one selected from the group consisting of carbon, nitrogen, oxygen, boron, aluminum, gallium, bismuth, tellurium, silicon, germanium, and the combination thereof.

6. The multi-layered phase-change memory device as claimed in claim 4, wherein the doped single element comprises a dopant.

7. The multi-layered phase-change memory device as claimed in claim 1, wherein the memory-layer comprises 3 to 50 mole percent homogeneously dispersed inert nano-particles and a size of the inert nano-particles is less than the thickness of the memory-layer.

8. The multi-layered phase-change memory device as claimed in claim 7, wherein the inert nano-particles are not physically and chemically reactive to the doped element at 1000° C. and are made of one selected from the group consisting of oxides, nitrides, carbides, silicides, borides, antimonides, and the combination thereof.

9. The multi-layered phase-change memory device as claimed in claim 1, wherein the material of each memory-layer in the multiple sandwich-memory-units is different.

10. The multi-layered phase-change memory device as claimed in claim 1, wherein an electrical resistivity of materials of the first and the second electrical conductive barrier layers is less than 1000 mΩ-cm at room temperature; the material of the first and the second electrical conductive barrier layers are characteristic of a stable solid state up to a temperature of at least 1000° C., not having physical or chemical reactions with the memory-layer; and can be chosen from tungsten, molybdenum, ruthenium, tantalum, rhenium, iridium, silicon carbide, molybdenum silicide, lanthanum hexaboride, titanium carbide, tantalum carbide, titanium boride, hafnium antimonide, ruthenium oxide, titanium nitride, tantalum nitride, titanium antimonide, yttrium antimonide, zirconium antimonide, lanthanum nickel oxide, or the combination thereof.

11. The multi-layered phase-change memory device as claimed in claim 1, wherein the material of the first and the second electrode possesses an electrical resistivity less than 50 mΩ-cm at the room temperature, and are a stable solid state up to a temperature of at least 1200° C., and can be chosen from ruthenium, tungsten, tantalum, ruthenium oxide, ruthenium dioxide, titanium nitride, or tantalum nitride.

12. The multi-layered phase-change memory device as claimed in claim 1, wherein the material of the dielectric layer is physically and chemically unreactive with the memory-layer at 1200° C., and wherein the material of the dielectric layer is one selected from the group consisting of silicon dioxide, silicon nitride, silicon oxynitride, aluminum oxide, aluminum nitride, hafnium oxide, titanium oxide, and magnesium oxide.

13. The multi-layered phase-change memory device as claimed in claim 1, wherein the multiple sandwich memory units are connected in series, and wherein the current provided by the first and the second electrodes flows vertically through the planes of the memory-layers.

14. The multi-layered phase-change memory device as claimed in claim 13, wherein the two barrier-layers are electrically conductive, and wherein the two barrier-layers each has an electrical resistivity less than 1000 mΩ/cm at the room temperature, and is a stable solid state up to a temperature of at least 1000° C., not having physical or chemical reactions with the memory-layer; and can be chosen from tungsten, molybdenum, ruthenium, tantalum, rhenium, iridium, silicon carbide, molybdenum silicide, lanthanum hexaboride, titanium carbide, tantalum carbide, titanium boride, hafnium antimonide, ruthenium oxide, titanium nitride, tantalum nitride, titanium antimonide, yttrium antimonide, zirconium antimonide, lanthanum-nickel oxide, or the combination thereof.

15. The multi-layered phase-change memory device as claimed in claim 1, wherein the multiple sandwich memory units are connected in parallel, and wherein the current provided by the first and the second electrodes is parallel with the planes of the memory-layers.

16. The multi-layered phase-change memory device as claimed in claim 15, wherein the two barrier-layers are electrically insulating, and wherein the two barrier-layers are physically and chemically unreactive with the memory-layer at a temperature of at least 1200° C., the material of the insulating barrier layer can be chosen from antimony oxide, zirconium oxide, hafnium oxide, titanium oxide, aluminium nitride, silicon nitride, silicon oxide, silicon oxynitride, aluminum oxide, or magnesium oxide.

17. The multi-layered phase-change memory device as claimed in claim 1, wherein the two barrier-layers are formed of different materials.

18. A multi-layered phase-change memory device, comprising:
  a substrate;
  a dielectric layer, disposed on the substrate;
  a first electrode-assembly-layer, comprising:
    a first electrode, disposed on the dielectric layer; and
    a first electrical conductive barrier layer, physically and electrically connected with the first electrode;
  a first sandwich-memory-unit, comprising:
    a first barrier-layer, disposed on and electrically connected to the first electrical conductive barrier layer;
    a first memory-layer, physically and electrically connected to the first barrier-layer; and
    a second barrier-layer, physically and electrically connected to the first memory-layer;
  a second sandwich-memory-unit, comprising:
    a second memory-layer, physically and electrically connected to the second barrier-layer; and
    a third barrier-layer, physically and electrically connected to the second memory-layer; and
  a second electrode-assembly-layer, comprising:
    a second electrical conductive barrier layer, disposed on and electrically connected with the third barrier-layer; and
    a second electrode, physically and electrically connected with the second electrical conductive barrier layer;
  wherein the first memory-layer and the second memory-layer each is formed of about 99 at % Sb or Bi and each has a thickness ranging from 30 to 50 nm;
  wherein the first barrier-layer, the second barrier-layer, and the third barrier-layer are electrical conductive and are not physically/chemically reactive to the first memory-layer and the second memory-layer;
  wherein the first barrier-layer, the second barrier-layer, and the third barrier-layer each has an electrical resistivity less than 1000 mΩ/cm at room temperature and a melting point higher than 1000° C.;
  wherein the current provided by the first electrode-assembly-layer and the second electrode-assembly-layer flows vertically through the layers in the first sandwich-memory-unit and the second sandwich-memory-unit.

* * * * *